United States Patent
Okamoto

(10) Patent No.: US 10,541,321 B2
(45) Date of Patent: Jan. 21, 2020

(54) MANUFACTURING METHOD OF SEMICONDUCTOR DEVICE

(71) Applicant: Renesas Electronics Corporation, Tokyo (JP)

(72) Inventor: Yasuhiro Okamoto, Hitachinaka (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/028,128

(22) Filed: Jul. 5, 2018

(65) Prior Publication Data

US 2019/0051740 A1    Feb. 14, 2019

(30) Foreign Application Priority Data

Aug. 9, 2017  (JP) .................................. 2017-154110

(51) Int. Cl.
*H01L 21/00*   (2006.01)
*H01L 29/778*  (2006.01)
(Continued)

(52) U.S. Cl.
CPC ........ *H01L 29/778* (2013.01); *H01L 21/0228* (2013.01); *H01L 23/5329* (2013.01);
(Continued)

(58) Field of Classification Search
CPC ............. H01L 21/0254; H01L 21/0228; H01L 21/0237; H01L 21/2458; H01L 21/318;
(Continued)

(56) References Cited

U.S. PATENT DOCUMENTS

| 6,064,082 | A  | * | 5/2000 | Kawai ................. H01L 29/7783 |
|           |    |   |        | 257/191 |
| 8,716,755 | B2 | * | 5/2014 | Inoue .................... H01L 29/205 |
|           |    |   |        | 257/194 |
| 2013/0069071 | A1 | * | 3/2013 | Inoue .................... H01L 29/205 |
|           |    |   |        | 257/76 |

FOREIGN PATENT DOCUMENTS

| JP | 5684574 B2 | 3/2015 |
| WO | WO 2010/064706 A1 | 6/2010 |

OTHER PUBLICATIONS

Grabowski et al., "Electron affinity of AlxGa1-x N (0001) surfaces", 2001, Applied.*

(Continued)

*Primary Examiner* — Nikolay K Yushin
(74) *Attorney, Agent, or Firm* — McDermott Will & Emery LLP

(57) ABSTRACT

In a manufacturing method of a semiconductor device according to the present invention, a buffer layer including a first nitride semiconductor layer, a channel layer including a second nitride semiconductor layer, and a barrier layer including a third nitride semiconductor layer are sequentially laminated, and a fourth nitride semiconductor layer is further laminated thereover. Then, a laminate of a gate insulating film and a gate electrode is formed over a first region of the fourth nitride semiconductor layer, and a silicon nitride film is formed over the fourth nitride semiconductor layer and the laminate. By bringing the fourth nitride semiconductor layers on both sides of the gate electrode into contact with the silicon nitride film in this way, the function of suppressing 2DEG can be lowered, and the 2DEG that has been eliminated after the formation of the fourth nitride semiconductor layer can be restored. The lowering in the function of suppressing 2DEG is maintained even after the silicon nitride film is removed.

13 Claims, 29 Drawing Sheets

(51) Int. Cl.
| | |
|---|---|
| *H01L 29/66* | (2006.01) |
| *H01L 21/02* | (2006.01) |
| *H01L 29/423* | (2006.01) |
| *H01L 23/532* | (2006.01) |
| *H01L 29/417* | (2006.01) |
| *H01L 29/00* | (2006.01) |
| *H01L 29/20* | (2006.01) |

(52) U.S. Cl.
CPC .... *H01L 29/41725* (2013.01); *H01L 29/4232* (2013.01); *H01L 29/66462* (2013.01); *H01L 21/0254* (2013.01); *H01L 29/2003* (2013.01)

(58) Field of Classification Search
CPC ........... H01L 23/5329; H01L 23/42316; H01L 23/318; H01L 29/778; H01L 29/2003; H01L 29/66462; H01L 29/41725; H01L 29/4232; H01L 23/3771; H01L 23/5226; H01L 23/66
See application file for complete search history.

(56) References Cited

OTHER PUBLICATIONS

Mao et al., "Correspondence Relation Between [N—H] / [Si—H] Ratio and Their Optical Loss Properties in Silicon Nitride Thin Films", 2009, IEEE, ICIEA 2009, pp. 3319-3322, Dec. 2009.*

* cited by examiner

FIG. 6

| | 0 | 1 | 2 | 3 | 4 | 5 | 6 |
|---|---|---|---|---|---|---|---|
| FILM TYPE | SiN | SiO$_2$ | SiN | SiO$_2$ | SiN | SiO$_2$ | Al$_2$O$_3$ |
| FILM FORMATION PROCESS | P-CVD | ATMOSPHERIC PRESSURE CVD PROCESS | SPUTTERING | SPUTTERING | LPCVD | LPCVD | ALD |
| FILM FORMATION TEMPERATURE | 400°C | 400°C | RT | RT | 800°C | 800°C | 300°C |
| FILM THICKNESS | 90nm | 90nm | 90nm | 90nm | 45nm / 90nm | 90nm | 100nm |
| RESTORATION OF 2DEG | PRESENCE | ABSENCE | PRESENCE | ABSENCE | ABSENCE / PRESENCE | ABSENCE | ABSENCE |

MANUFACTURING METHOD OF SEMICONDUCTOR DEVICE

CROSS-REFERENCE TO RELATED APPLICATIONS

The disclosure of Japanese Patent Application No. 2017-154110 filed on Aug. 9, 2017 including the specification, drawings and abstract is incorporated herein by reference in its entirety.

BACKGROUND

The present invention relates to a manufacturing method of a semiconductor device and a semiconductor device, and can be suitably used, for example, for a semiconductor device using a nitride semiconductor.

Because GaN-based nitride semiconductors have a wider band gap and higher electron mobility than Si-based and GaAs-based semiconductors, they are expected to be applied to transistors for high breakdown voltage, high output, or high frequency applications, and have been actively developed in recent years. Among such transistors, transistors having a normally-off characteristic are useful, and structures for providing a normally-off characteristic have been studied.

For example, Patent Document 1 discloses a semiconductor device including an underlayer, an electron supply layer, a two-dimensional electron gas elimination layer, a first insulating film, and a gate electrode.

RELATED ART DOCUMENT

Patent Document

[Patent Document 1] Japanese Patent Publication No. 5684574

SUMMARY

The present inventors are engaged in the research and development of a semiconductor device using a nitride semiconductor, and are intensively studying to improve the characteristics of the semiconductor device. In particular, the structure of a transistor for providing a normally-off characteristic (mesa MOS structure) is being studied.

And, in a process of the research and development of a semiconductor device using a nitride semiconductor, the present inventors have found the phenomenon that when a silicon nitride film is brought into contact with a mesa portion (two-dimensional electron gas elimination layer), the eliminated 2DEG is restored, as described later.

Further, in a transistor having a mesa MOS structure, a failure caused by a damage during processing of the mesa portion has been confirmed, as described later.

In view of these, the present inventors have invented and provided a semiconductor device having good characteristics, in which the above phenomenon is utilized, a new type nitride semiconductor is used, and the above failure is eliminated.

Other problems and new characteristics will become clear from the description and accompanying drawings of the present specification.

Among the embodiments disclosed in the present application, the outlines of representative ones will be briefly described as follows.

A manufacturing method of a semiconductor device described in one embodiment disclosed in the present application includes the steps of: (a) forming a second nitride semiconductor layer over a first nitride semiconductor layer; and (b) forming a third nitride semiconductor layer over the second nitride semiconductor layer. Further, it includes the steps of: (c) forming a fourth nitride semiconductor layer over the third nitride semiconductor layer; (d) forming a first film over a first region of the fourth nitride semiconductor layer; and (e) forming a silicon nitride film over the fourth nitride semiconductor layer and the first film. Herein, after the step (b), two-dimensional electron gas is generated near the interface between the second nitride semiconductor layer and the third nitride semiconductor layer; after the step (c), the two-dimensional electron gas is eliminated; and after the step (e), the two-dimensional electron gas is restored in second regions on both sides of the first region.

A manufacturing method of a semiconductor device described in one embodiment disclosed in the present application includes the steps of: (a) forming a second nitride semiconductor layer over a first nitride semiconductor layer; (b) forming a third nitride semiconductor layer over the second nitride semiconductor layer; and (c) forming a fourth nitride semiconductor layer over the third nitride semiconductor layer. Further, it includes the steps of: (d) forming a first film over a first region of the fourth nitride semiconductor layer; (e) forming a silicon nitride film over the fourth nitride semiconductor layer and the first film; and (f) removing the silicon nitride film. Herein, the electron affinity of the second nitride semiconductor layer is equal to or larger than that of the first nitride semiconductor layer, the electron affinity of the third nitride semiconductor layer is smaller than that of the first nitride semiconductor layer, and the electron affinity of the fourth nitride semiconductor layer is larger than that of the first nitride semiconductor layer.

A semiconductor device described in one embodiment disclosed in the present application includes: a first nitride semiconductor layer; a second nitride semiconductor layer formed thereover; a third nitride semiconductor layer formed over the second nitride semiconductor layer; and a fourth nitride semiconductor layer that is formed over the third nitride semiconductor layer and has a first region and second regions located on both sides of the first region. Further, it includes: a source electrode that is formed over the fourth nitride semiconductor layer and in the second region on one side of the first region; a drain electrode that is formed over the fourth nitride semiconductor layer and in the second region on the other side of the first region; and a gate electrode that is formed above the first region of the fourth nitride semiconductor layer. Herein the electron affinity of the second nitride semiconductor layer is equal to or larger than that of the first nitride semiconductor layer, the electron affinity of the third nitride semiconductor layer is smaller than that of the first nitride semiconductor layer, and the electron affinity of the fourth nitride semiconductor layer is larger than that of the first nitride semiconductor layer.

According to a manufacturing method of a semiconductor device described in the below-described representative embodiments disclosed in the present application, a semiconductor device having good characteristics can be manufactured.

According to a semiconductor device described in the below-described representative embodiments disclosed in the present application, the characteristics of the semiconductor device can be improved.

BRIEF DESCRIPTION OF THE DRAWINGS

FIG. 6 is a table showing the presence/absence of the restoration of 2DEG in the manufactured devices;

DETAILED DESCRIPTION

Figure 1:
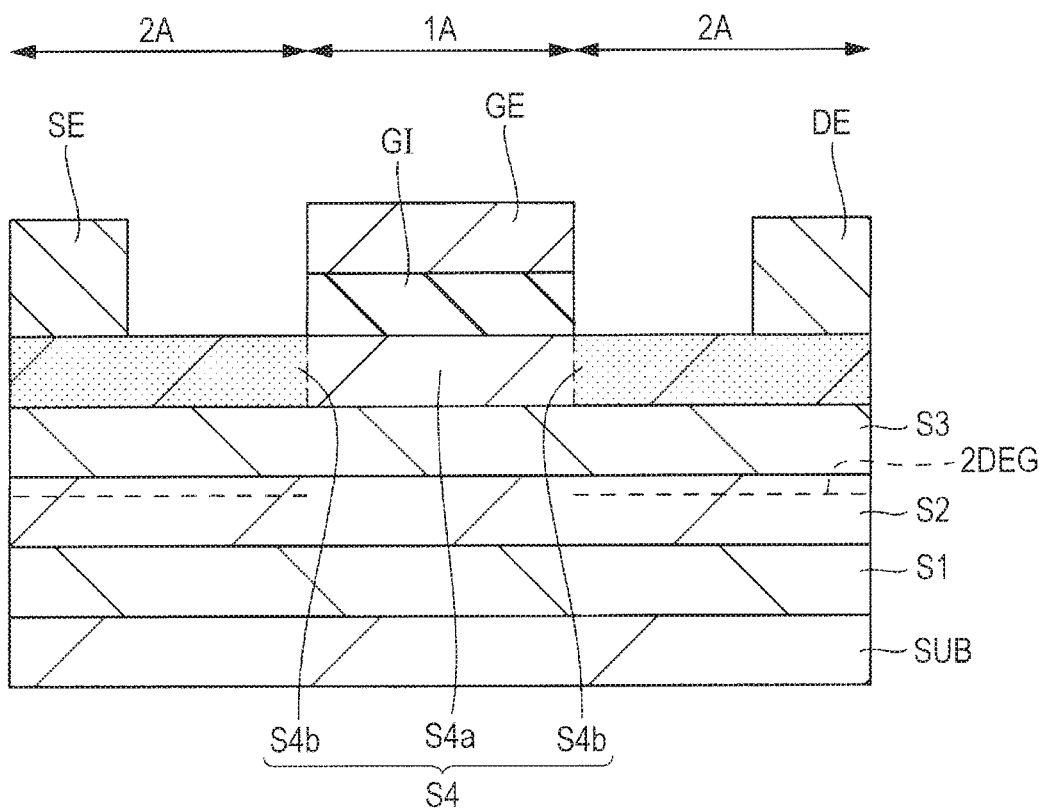
FIG. 1 is a sectional view illustrating a schematic configuration of a semiconductor device according to First Embodiment.

If needed for convenience, the following embodiments will be described by dividing each of them into multiple sections or embodiments; however, the multiple sections or embodiments are not irrelevant to each other, but they are in a relationship in which one is a variation, application example, detailed description, or supplementary description of part or the whole of the others, unless expressly stated otherwise. When the numbers of elements, etc. (including numbers of pieces, numerical values, amounts, ranges, etc.) are referred to in the following embodiments, the numbers are not limited to the specific ones but may be more or less than the specific numbers, unless expressly stated otherwise or except when the numbers are obviously limited to the specific numbers in principle.

Further, in the following embodiments, the constituents (also including element steps, etc.) are not necessarily essential, unless expressly stated otherwise or clearly essential in principle. Similarly, in the following embodiments, when the shapes and positional relations, etc., of the constituent elements, etc., are referred to, those substantially the same as or similar to the shapes, etc., should be included, unless expressly stated otherwise or except when considered to be clearly otherwise in principle. The same is true with the aforementioned numbers, etc., (including the numbers of pieces, numerical values, amounts, and ranges, etc.).

Hereinafter, preferred embodiments will be described in detail based on the accompanying views. In the whole views for explaining the embodiments, members having the same function as each other will be denoted with the same or relevant reference numerals and duplicative description will be omitted. When a plurality of similar members (parts) are present, an individual or specific part may be represented by adding a sign to the collective reference numeral. In the following embodiments, description of the same or similar parts will not be repeated in principle, unless particularly necessary.

In the views used in the embodiments, hatching may be omitted even in sectional views in order to make them easier to see. Alternatively, hatching may be added even in plan views in order to make them easier to see.

In a sectional view or a plan view, the size of each part does not correspond to that of an actual device, and a specific part may be displayed to be relatively large in order to make the view easier to understand. The same is true with the case where a sectional view and a plan view correspond to each other.

First Embodiment

Hereinafter, a semiconductor device according to the present embodiment will be described in detail with reference to the views.

FIG. 1 is a sectional view illustrating a schematic configuration of a semiconductor device according to the present embodiment.

The semiconductor device illustrated in FIG. 1 is a MOS-type field effect transistor (MOSFET; Metal-Oxide-Semiconductor Field Effect Transistor, also referred to as MISFET) using a nitride semiconductor. It is also referred to as a high electron mobility transistor (HEMT).

In the semiconductor device according to the present embodiment, a first nitride semiconductor layer S1, a second nitride semiconductor layer S2, a third nitride semiconductor layer S3, and a fourth nitride semiconductor layer S4 are sequentially formed over a substrate SUB, as illustrated in FIG. 1.

The electron affinity (EA) of the second nitride semiconductor layer S2 is equal to or larger than that of the first nitride semiconductor layer S1 (EAS1≤EAS2).

The electron affinity of the third nitride semiconductor layer S3 is smaller than that of the first nitride semiconductor layer S1 (EAS1>EAS3).

The electron affinity of the fourth nitride semiconductor layer S4 is larger than that of the first nitride semiconductor layer S1 (EAS4>EAS1).

The first nitride semiconductor layer S1 is also referred to as a buffer layer and includes, for example, AlGaN. The second nitride semiconductor layer S2 is also referred to as a channel layer and includes, for example, GaN. The third nitride semiconductor layer S3 is referred to as a barrier layer (electron supply layer) and includes, for example, AlGaN. However, the Al composition thereof is higher than that of the first nitride semiconductor layer S1.

Herein, the fourth nitride semiconductor layer S4 includes, for example, i-GaN. That is, the fourth nitride semiconductor layer S4 is not intentionally doped with n-type impurities or p-type impurities. In addition, the fourth nitride semiconductor layer S4 is a layer having a substantially uniform thickness. In addition, a portion of the fourth nitride semiconductor layer S4, located in a first region 1A, is referred to as a first portion S4$a$, and each of portions located in second regions 2A on both sides of the first region is referred to as a second portion S4$b$.

A gate electrode GE is formed over the first region 1A of the fourth nitride semiconductor layer S4 via a gate insulating film GI. A source electrode SE is formed in the second region 2A located over the fourth nitride semiconductor layer S4 and on one side of the first region 1A; and a drain electrode DE is formed in the second region 2A located over the fourth nitride semiconductor layer S4 and on the other side of the first region 1A. In other words, the gate electrode GE is formed over the first portion S4$a$ of the fourth nitride semiconductor layer S4 via the gate insulating film GI. The source electrode SE is formed in the second portion S4$b$ on one side of the first portion S4$a$ of the fourth nitride semiconductor layer S4, and the drain electrode DE is formed in the second portion S4$b$ on the other side thereof.

The second portion S4$b$ of the fourth nitride semiconductor layer S4 is a film having a history of contact with a silicon nitride film. This second portion S4$b$ may be referred to as a "silicon nitride contact portion." On the other hand, the first portion S4$a$ of the fourth nitride semiconductor layer S4 is a film having no history of contact with a silicon nitride film. This first portion S4$a$ may be referred to as a "silicon nitride non-contact portion."

Herein, 2DEG (two-dimensional electron gas) is generated near the interface between the second nitride semiconductor layer (channel layer) S2 and the third nitride semiconductor layer (barrier layer) S3 and on the side of the second nitride semiconductor layer S2. The fourth nitride semiconductor layer S4 has the function of suppressing the 2DEG. The function of suppressing 2DEG can also be referred to as the function of lowering the concentration of 2DEG (two-dimensional electron gas). Therefore, the fourth nitride semiconductor layer S4 is also referred to as a 2DEG suppression layer (2DEG elimination layer). In the present embodiment, however, the function of suppressing 2DEG is lowered in the second portion S4$b$ of the fourth nitride semiconductor layer S4 due to the contact with the above silicon nitride film. Therefore, 2DEG is generated in the second portion S4$b$ of the fourth nitride semiconductor layer S4.

Therefore, when a predetermined voltage (threshold voltage) is applied to the gate electrode GE, a channel is formed below the gate electrode GE and the portion between the 2DEG is conducted by this channel, whereby the transistor is turned on. That is, a normally-off operation can be achieved.

In the present embodiment, the function of suppressing 2DEG is lowered in the second portion S4$b$ of the fourth nitride semiconductor layer S4 due to the contact with the above silicon nitride film so that 2DEG is generated, whereby a normally-off configuration is achieved as described above, and hence the later-described advantages can be obtained, as compared with a so-called mesa MOS structure (see FIG. 4) in which the second region 2A of the fourth nitride semiconductor layer S4 is removed to generate 2DEG.

Before the advantages are described, the lowering in the function of suppressing 2DEG of the fourth nitride semiconductor layer S4 due to contact with a silicon nitride film will be first described based on the following First and Second Examples.

First Example

Figure 3:
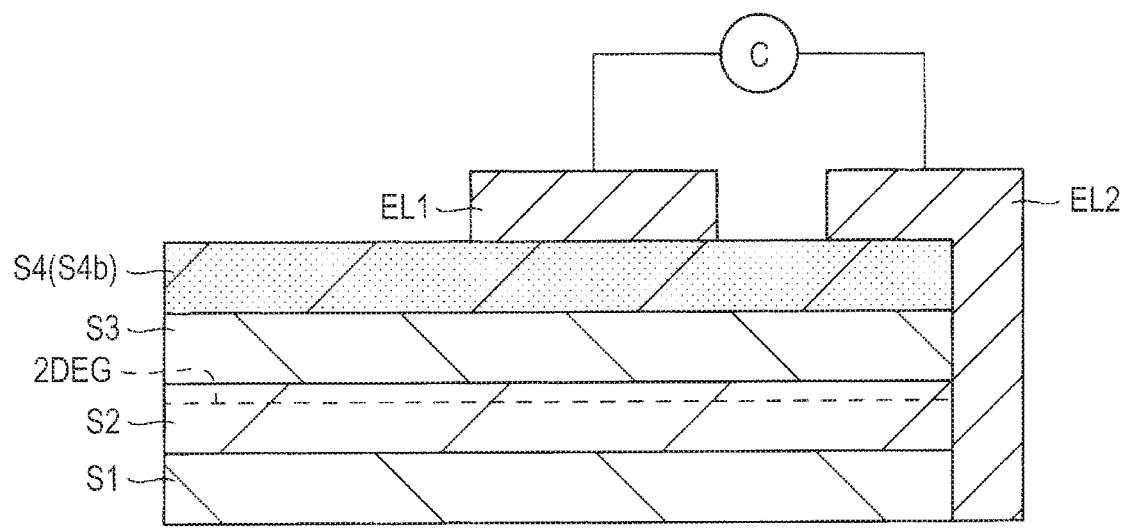
FIG. 3 is a view illustrating a step of measuring the CV characteristics of the test device.
Figure 4:
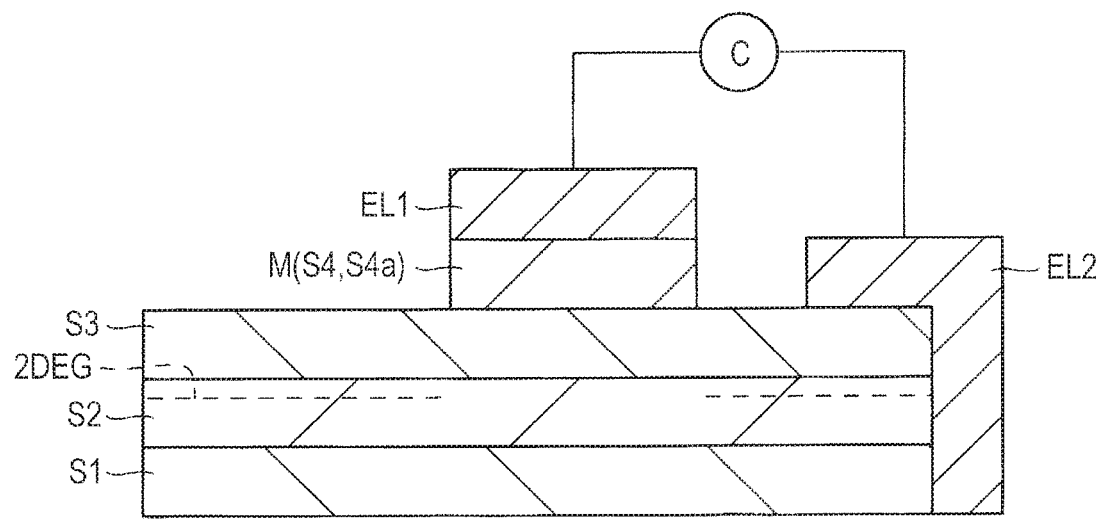
FIG. 4 is a view illustrating a step of measuring the CV characteristics of a comparative example device.
Figure 5:
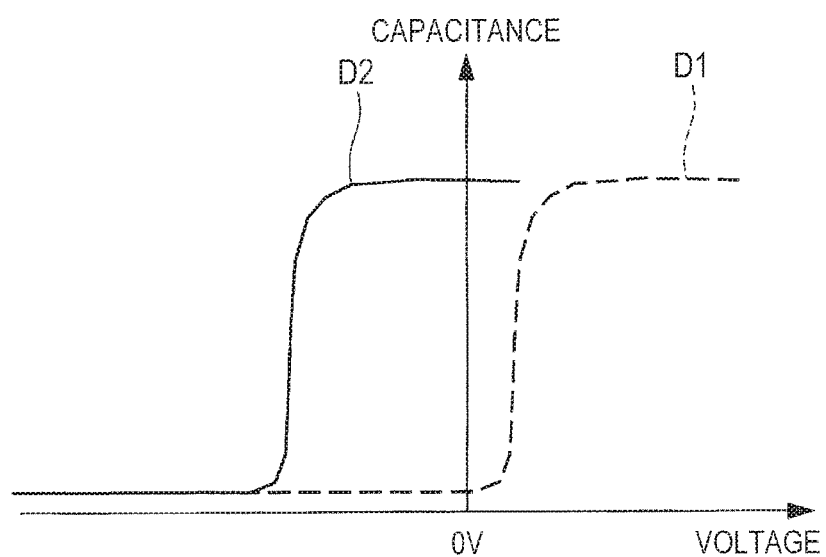
FIG. 5 is a graph showing measurement results of the CV characteristics of the test device and the comparative example device.

FIGS. 2A to 2D are views each illustrating a processing step of a test device in the present example; FIG. 3 is a view illustrating a step of measuring the CV characteristics of the test device; and FIG. 4 is a view illustrating a step of measuring the CV characteristics of a comparative example device. FIG. 5 is a graph showing measurement results of the CV characteristics of the test device and the comparative example device.

Figure 2A:
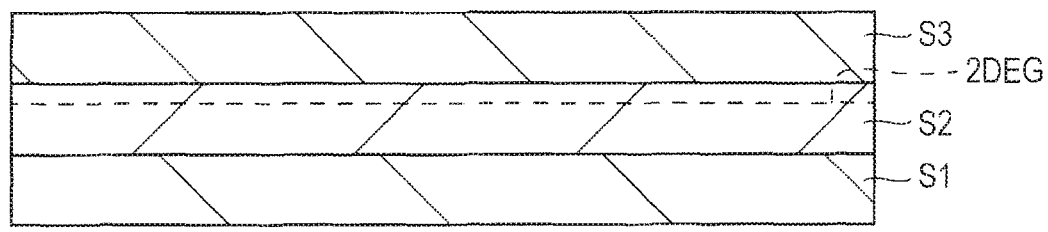
FIGS. 2A to 2D are views each illustrating a processing step of a test device in Examples.

As illustrated in FIG. 2A, the first nitride semiconductor layer S1, the second nitride semiconductor layer S2, and the third nitride semiconductor layer S3 are sequentially formed over a substrate (not illustrated). After the formation of the third nitride semiconductor layer S3, 2DEG (two-dimensional electron gas) is generated near the interface between the second nitride semiconductor layer S2 and the third nitride semiconductor layer S3 and on the side of the second nitride semiconductor layer S2 due to piezoelectric polarization (caused by a lattice constant difference) and spontaneous polarization.

Figure 2B:
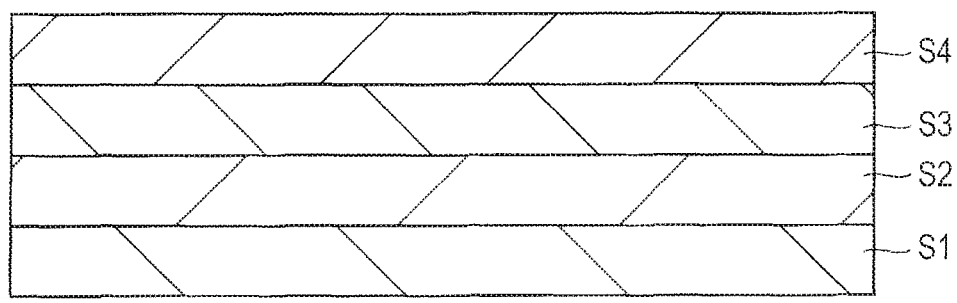
Figure 2C:
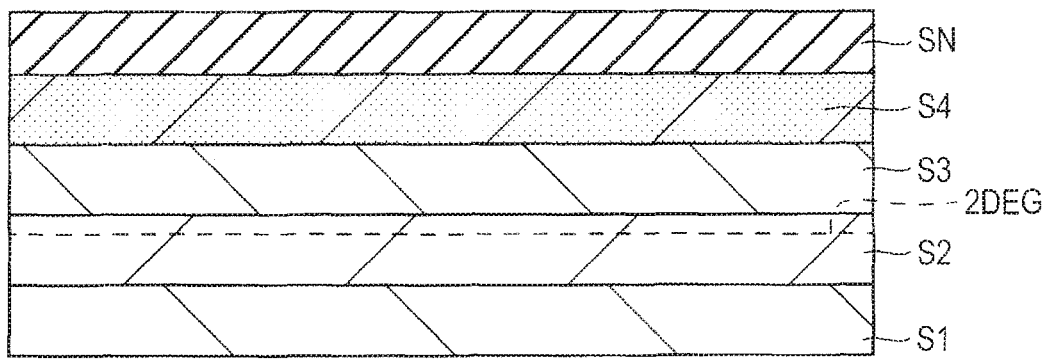
Figure 2D:
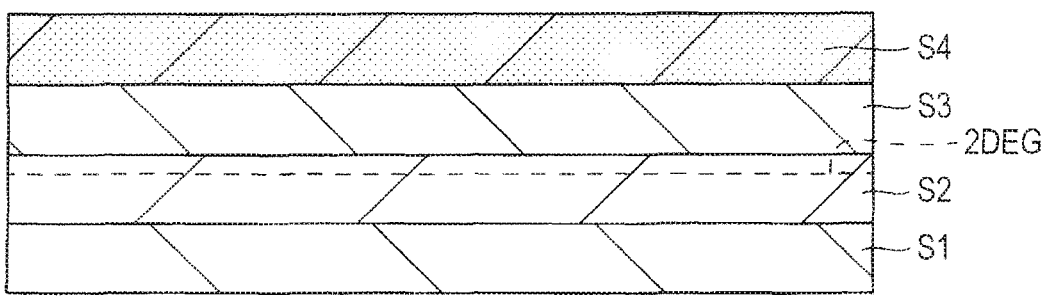

Next, when the fourth nitride semiconductor layer S4 is formed over the third nitride semiconductor layer S3, the 2DEG is eliminated as illustrated in FIG. 2B. Next, a silicon nitride film SN is formed over the fourth nitride semiconductor layer S4, as illustrated in FIG. 2C. Next, the silicon nitride film SN is removed as illustrated in FIG. 2D. Next, an Au film to serve as a first electrode EL1 is formed over the fourth nitride semiconductor layer S4 and then the film is patterned, whereby the first electrode EL1 is formed (see FIG. 3). A second electrode EL2 is formed by forming an In film over the fourth nitride semiconductor layer S4 and over the side surface of the sample piece. The test device was manufactured in this way.

On the other hand, the comparative example device was manufactured as follows (see FIG. 4). First, the first nitride semiconductor layer S1, the second nitride semiconductor layer S2, the third nitride semiconductor layer S3, and the fourth nitride semiconductor layer S4 are sequentially formed over a substrate. Next, an Au film to serve as the first electrode EL1 is formed over the fourth nitride semiconductor layer S4, and then the film is patterned, whereby a laminate of a mesa portion M including the fourth nitride semiconductor layer S4 and the first electrode EL1 is formed. The second electrode EL2 is formed by forming an In film over the third nitride semiconductor layer S3 and over the side surface of the sample piece. In the case of this comparative example device, the fourth nitride semiconductor layers S4 on both sides of the first electrode EL1 are removed, and hence 2DEG is generated, whereby a so-called mesa Schottky diode is obtained (see FIG. 4).

The CV characteristics between the first and second electrodes (EL1, EL2) were measured for each of the test device and the comparative example device. The results are shown in FIG. 5. In FIG. 5, the horizontal axis represents voltage (V) and the vertical axis represents capacitance (C).

The graph D1 in FIG. 5 shows the CV characteristics of the comparative example device. The graph D2 shows the CV characteristics of the test device. In the graph D1 (comparative example device), no capacitance is detected at a voltage of 0 V, that is, at a thermal equilibrium state (0 V), and hence it can be seen that 2DEG does not exist. Then, 2DEG is generated by applying a positive voltage, so that a capacitance is detected.

On the other hand, in the graph D2 (test device), a capacitance is detected at a voltage of 0 V, that is, at a thermal equilibrium state (0 V), and hence it can be seen that 2DEG exists. Then, the 2DEG is eliminated when a negative voltage is applied, so that no capacitance is detected.

Thus, it has been found from the results of the present example that when the silicon nitride film SN is formed over the fourth nitride semiconductor layer S4, the function of suppressing 2DEG of the fourth nitride semiconductor layer S4 is lowered and 2DEG is generated. And, it has been found that the lowering in the function of suppressing 2DEG is maintained even after the silicon nitride film SN is removed.

Therefore, in the semiconductor device (FIG. 1) according to the present embodiment in which the fourth nitride semiconductor layers S4 on both sides of the gate electrode GE are not removed, the function of suppressing 2DEG can be lowered (the concentration of 2DEG can be lowered) by performing, in the fourth nitride semiconductor layers S4 on both sides of the gate electrode GE, contact processing with a silicon nitride film, so that the 2DEG that has been eliminated after the formation of the fourth nitride semiconductor layer S4 can be restored. Therefore, a transistor, having a "planar structure" in which a mesa portion is not formed, can be achieved.

Second Example

Various devices were manufactured in the same way as the test device described with reference to FIGS. 2 and 3, so that the presence/absence of the restoration of 2DEG was studied. FIG. 6 shows the results.

The uppermost row shown in FIG. 6 shows device Nos. A device 0 corresponds to the test device of the above First Example. As described above, the film used for the contact processing is a silicon nitride film (SiN). Specifically, a silicon nitride film having a thickness of 90 nm, which was formed by a plasma CVD (Chemical Vapor Deposition) process in which the temperature was 400° C., was used. In this case, the restoration of 2DEG was confirmed as described above. Herein, the thickness of an AlGaN (Al composition ratio 5%) layer of the device 0, the first nitride semiconductor layer S1, is 1 μm; that of a GaN layer, the second nitride semiconductor layer S2, is 40 nm; that of an AlGaN (Al composition ratio 22%) layer, the third nitride semiconductor layer S3, is 14 nm; and that of an i-GaN layer, the fourth nitride semiconductor layer S4, is 25 nm.

Each of the devices (devices 1 to 6) was manufactured by changing the film used for the contact processing of the test device (device 0) as shown in FIG. 6, so that the presence/absence of the restoration of 2DEG was confirmed.

In the device 1, a silicon oxide film (SiO$_2$) having a thickness of 90 nm, which was formed by an atmospheric pressure CVD process in which the temperature was 400° C., was used for the contact processing. In this case, the restoration of 2DEG was not confirmed.

In the device 2, a silicon nitride film (SiN) having a thickness of 90 nm, which was formed by a sputtering process, was used for the contact processing. In this case, the restoration of 2DEG was confirmed.

In the device 3, a silicon oxide (SiO$_2$) having a thickness of 90 nm, which was formed by a sputtering process, was used for the contact processing. In this case, the restoration of 2DEG was not confirmed.

In the device 4, a silicon nitride film (SiN) having a thickness of 45 nm or 90 nm, which was formed by an LPCVD (Low Pressure Chemical Vapor Deposition) process in which the temperature was 800° C., was used for the contact processing. In this case, the restoration of 2DEG was confirmed when the thickness was 90 nm, but was not when the thickness was 45 nm.

In the device 5, a silicon oxide film (SiO$_2$) having a thickness of 90 nm, which was formed by an LPCVD process in which the temperature was 800° C., was used for the contact processing. In this case, the restoration of 2DEG was not confirmed.

In the device 6, an aluminum oxide film ($Al_2O_3$) having a thickness of 100 nm, which was formed by an ALD (Atomic Layer Deposition) process in which the temperature was 300° C., was used for the contact processing. In this case, the restoration of 2DEG was not confirmed.

As described above, it has been found that the lowering in the function of suppressing 2DEG of the fourth nitride semiconductor layer S4, due to contact processing with a film, is peculiar to a silicon nitride film. It has also been found that the function of suppressing 2DEG of the fourth nitride semiconductor layer S4 can be lowered in the case of a silicon nitride film, regardless of a film formation process or condition. It has also been found that the thickness of a silicon nitride film is less effective in 45 nm, is preferable to be more than 45 nm, and is more preferable to be equal to or more than 90 nm.

(Suitable Silicon Nitride Film)

The characteristics of a silicon nitride film formed by the above plasma CVD, in the film the restoration of 2DEG being confirmed by the contact processing with the film, were confirmed by using FTIR (Fourier Transform Infrared Spectroscopy). The silicon nitride film contains Si—H bonds and N—H bonds. It has been found that the ratio of the Si—H bonds to the N—H bonds in the silicon nitride film is 0.3 or more and 0.45 or less. Therefore, it is preferable in the contact processing with the film to use, among silicon nitride films, a silicon nitride film having a ratio of Si—H bonds to N—H bonds of 0.3 or more and 0.45 or less. In addition, there is the tendency that the hydrogen concentration in the nitride semiconductor layers (S1 to S4) after the formation of the silicon nitride film (including also after the removal thereof) is higher, that is, three to six times higher than that in the nitride semiconductor layers (S1 to S4) before the formation of the silicon nitride film.

Figure 36:
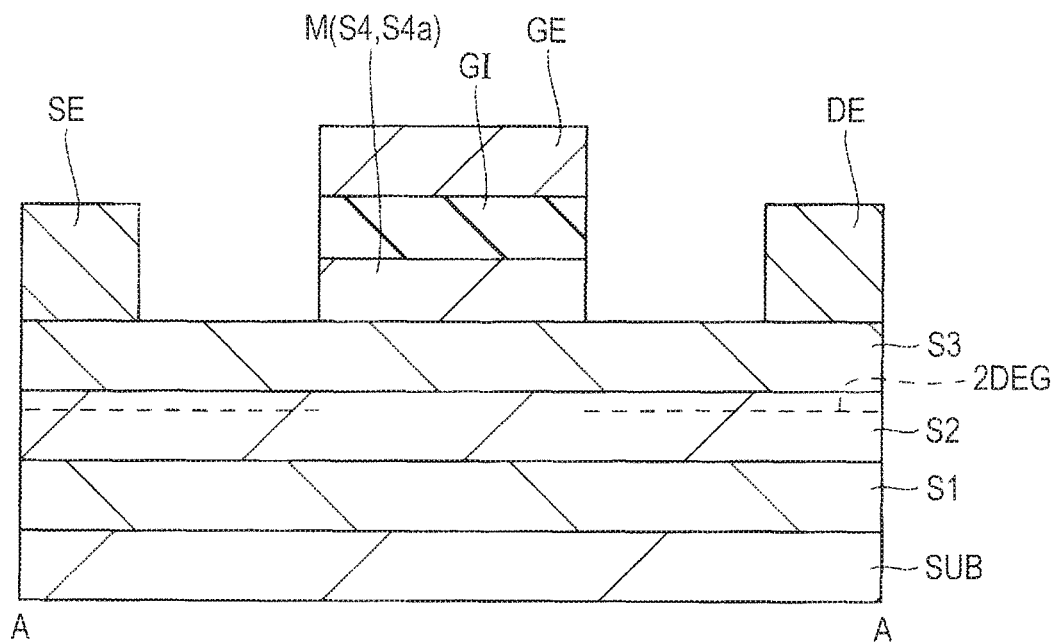
FIG. 36 is a sectional view illustrating a configuration of a semiconductor device of a comparative example.

Next, the advantages of the semiconductor device according to the present embodiment (FIG. 1) will be described in detail with reference to FIGS. 36 and 37. FIG. 36 is a sectional view illustrating a configuration of a semiconductor device of a comparative example. The same reference numerals are given to the same parts as those in First Embodiment (FIG. 1), and the description thereof will be omitted.

The semiconductor device of the comparative example illustrated in FIG. 36 has the first nitride semiconductor layer S1, the second nitride semiconductor layer S2, and the third nitride semiconductor layer S3 that are sequentially laminated over a substrate. A mesa portion (GaN cap) M including the fourth nitride semiconductor layer S4 is formed over part of the third nitride semiconductor layer S3. The gate electrode GE is formed over the mesa portion M via the gate insulating film GI.

The source electrode SE and the drain electrode DE are formed over the third nitride semiconductor layer S3 on both sides of the gate electrode GE, respectively.

In the semiconductor device of this comparative example, the generation of 2DEG is suppressed by the function of suppressing 2DEG of the fourth nitride semiconductor layer (2DEG elimination layer) S4 below the gate electrode GE. In the regions on both sides of the gate electrode GE, however, 2DEG is maintained because the fourth nitride semiconductor layer (2DEG elimination layer) S4 is not formed (is removed).

Figure 37:
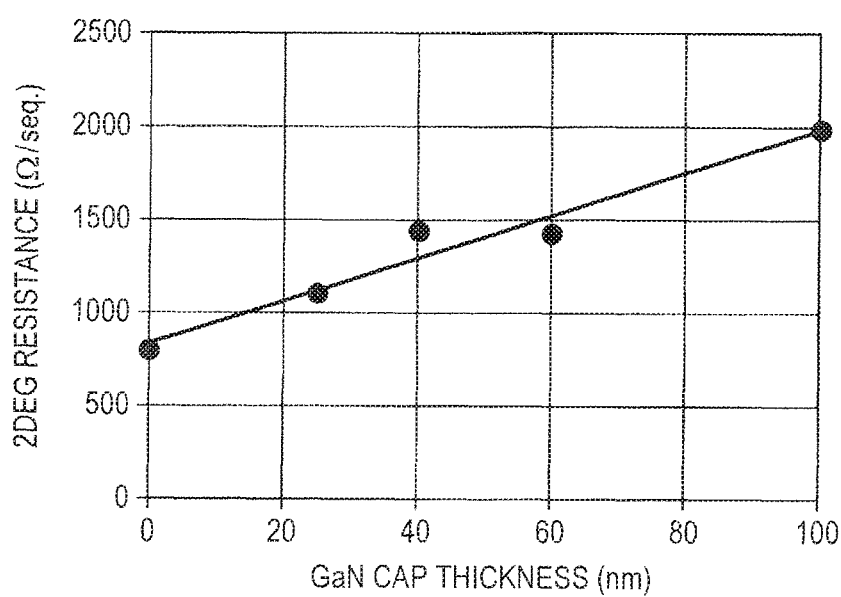
FIG. 37 is a graph showing the relationship between the film thickness of a mesa portion and 2DEG sheet resistance.

FIG. 37 is a graph showing the relationship between the film thickness of the mesa portion and the 2DEG sheet resistance of the region from which the fourth nitride semiconductor layer S4 is removed in the semiconductor device of the comparative example. The horizontal axis represents the thickness (nm) of the mesa portion (GaN cap), and the vertical axis represents 2DEG sheet resistance ($\Omega$/seq.).

In the semiconductor device of this comparative example, when the thickness of the mesa portion (GaN cap) was increased, the 2DEG sheet resistance of the region from which the fourth nitride semiconductor layer S4 was removed was increased, as shown in FIG. 37. The thickness of the mesa portion (GaN cap) M is only changed in these wafers, and hence the 2DEG sheet resistance of the region from which the fourth nitride semiconductor layer S4 has been removed should not be changed. In contrast, an increase in the 2DEG sheet resistance was actually observed, as shown in FIG. 37. It is considered that when the mesa portion M is formed by etching the thick fourth nitride semiconductor layer S4, the 2DEG sheet resistance is increased due to an etching damage.

In addition, in a state where an electric field by the gate electrode GE is applied to the mesa portion (2DEG suppression layer) M, a current path, passing through an undesired channel that is generated between the gate insulating film GI and the mesa portion M and travels along the side wall of the mesa portion (the end portion of the mesa portion), is generated.

In the semiconductor device of the comparative example, an increase in the 2DEG sheet resistance and an increase in on-resistance, which are caused by an etching damage occurring when the mesa portion M is formed, as described above, become problematic.

In the semiconductor device according to the present embodiment, however, a transistor having a "planar structure" in which no mesa portion is formed is obtained, and hence problems, such as an increase in on-resistance due to an increase in the 2DEG sheet resistance and a current path passing thorough an undesired channel, can be solved and the characteristics of the transistor can be improved.

Next, the semiconductor device according to the present embodiment will be described in more detail with reference to FIGS. 7 to 21.

[Structure Description]

Figure 7:
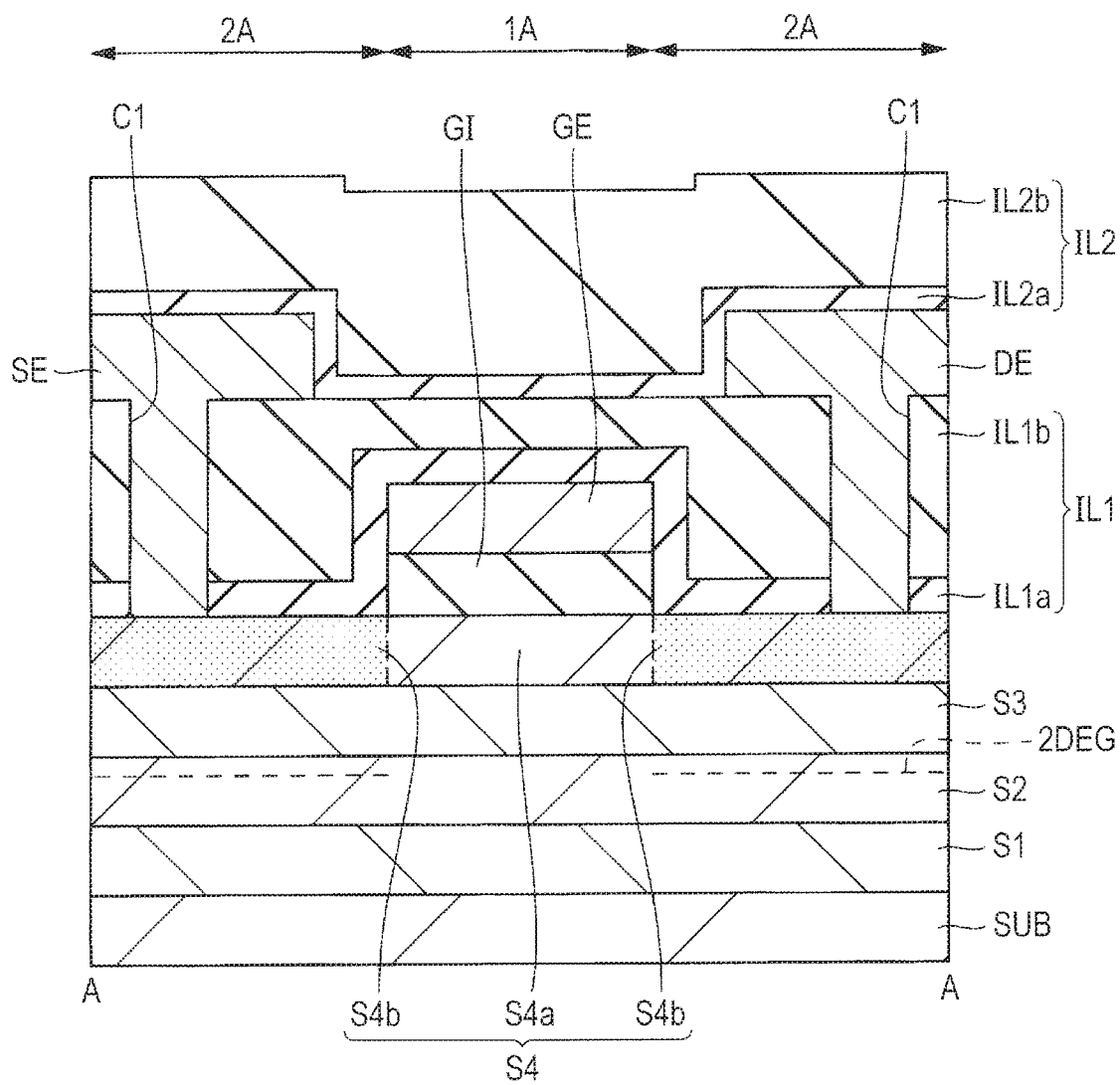
FIG. 7 is a sectional view illustrating a configuration of the semiconductor device according to First Embodiment.
Figure 8:
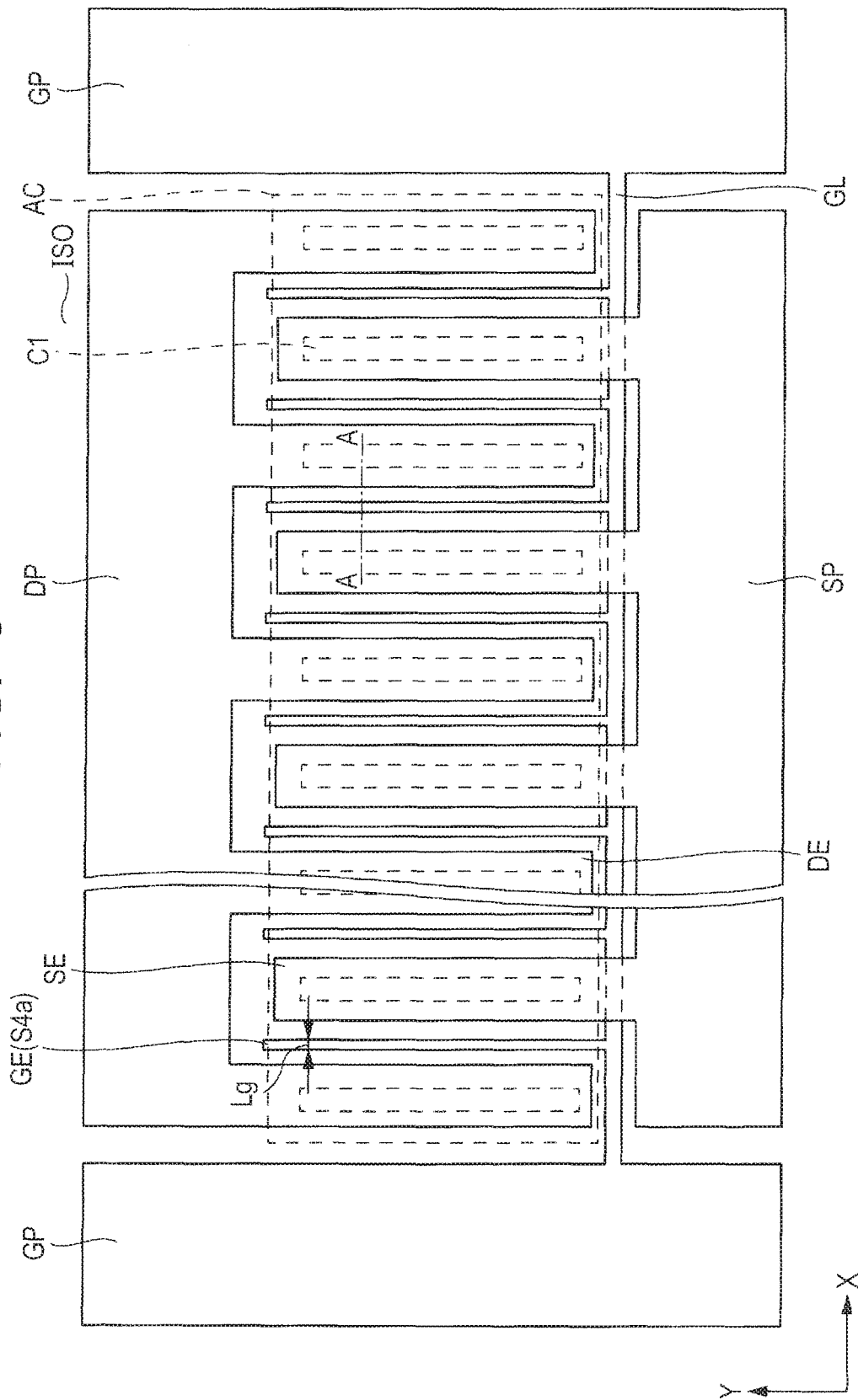
FIG. 8 is a plan view illustrating a configuration of the semiconductor device according to First Embodiment.

FIG. 7 is a sectional view illustrating a configuration of the semiconductor device according to the present embodiment. FIG. 8 is a plan view illustrating a configuration of the semiconductor device according to the embodiment. The sectional view of FIG. 7 corresponds, for example, to the A-A portion in FIG. 8.

In the semiconductor device illustrated in FIG. 7, the first nitride semiconductor layer S1, the second nitride semiconductor layer S2, the third nitride semiconductor layer S3, and the fourth nitride semiconductor layer S4 are sequentially formed over the substrate SUB. The fourth nitride semiconductor layer S4 has both the first portion S4a located in the first region 1A and the second portions S4b located in the second regions 2A on both sides of the first region. Each of the second portions S4b of the fourth nitride semiconductor layer S4 is a film having a history of contact with a silicon nitride film (silicon nitride contact portion), while the first portion S4a is a film having no history of contact with a silicon nitride film (silicon nitride non-contact portion).

The gate electrode GE is formed over the first portion S4a of the fourth nitride semiconductor layer S4 via the gate insulating film GI. The source electrode SE is formed in the second portion S4b on one side of the first portion S4a of the fourth nitride semiconductor layer S4, and the drain electrode DE is formed in the second portion S4b on the other side thereof. Herein, the source electrode SE is arranged in and above the contact hole C1 formed in an interlayer insulating film IL1 on one side of the gate electrode GE, while the drain electrode DE is arranged in and above the contact hole C1 formed in an interlayer insulating film IL1 on the other side of the gate electrode GE. An insulating film IL2 is formed over the source electrode SE and the drain electrode DE. Herein, the first to fourth nitride semiconductor layers (S1 to S4) may be sequentially formed over the substrate SUB after a nucleation layer and a high-resistance buffer layer are formed.

For example, a semiconductor substrate including silicon (Si) whose (111) plane is exposed can be used as the substrate SUB. Besides the above silicon, a substrate including SiC, sapphire, or the like may be used as the substrate SUB. Alternatively, a substrate including GaN may be used, and in this case the nucleation layer may be omitted.

The nucleation layer includes a nitride semiconductor layer. For example, an aluminum nitride (AlN) layer can be used as the nucleation layer. The high-resistance buffer layer includes one or more nitride semiconductor layers to which impurities, which form a deep level with respect to a nitride semiconductor, have been added. For example, a superlattice structure, in which a laminated film (AlN/GaN film) of a gallium nitride (GaN) layer and an aluminum nitride (AlN) layer is repeatedly laminated as a superlattice structure (also referred to as a superlattice layer) including a plurality of nitride semiconductor layers, can be used as the high-resistance buffer layer.

Herein, all of the nitride semiconductor layers (group III-V compound semiconductor layers) over the substrate SUB are generally formed by group III element plane growth.

As described above, the first nitride semiconductor layer S1, the second nitride semiconductor layer S2, the third nitride semiconductor layer S3, and the fourth nitride semiconductor layer S4 are sequentially formed over the substrate SUB.

The electron affinity (EA) of the second nitride semiconductor layer S2 is equal to or larger than that of the first nitride semiconductor layer S1 (EAS1≤EAS2).

The electron affinity of the third nitride semiconductor layer S3 is smaller than that of the first nitride semiconductor layer S1 (EAS1>EAS3).

The electron affinity of the fourth nitride semiconductor layer S4 is larger than that of the first nitride semiconductor layer S1 (EAS4>EAS1).

The first nitride semiconductor layer S1 is also referred to as a buffer layer and includes, for example, AlGaN. The second nitride semiconductor layer S2 is also referred to as a channel layer and includes, for example, GaN. The third nitride semiconductor layer S3 is referred to as a barrier layer (electron supply layer) and includes, for example, AlGaN. However, the Al composition of the third nitride semiconductor layer S3 is higher than that of the first nitride semiconductor layer S1. The Al composition of the first nitride semiconductor layer S1 is, for example, 0 to 10%, and more preferably 3 to 8%. The Al composition of the third nitride semiconductor layer S3 is, for example, 15 to 30%, and more preferably 18 to 22%. In addition, the fourth nitride semiconductor layer (cap layer) S4 is a non-doped layer and includes, for example, i-GaN, but AlGaN, having an Al composition lower than that of the first nitride semiconductor layer S1, may be used. Alternatively, InGaN may be used as the fourth nitride semiconductor layer S4.

The gate electrode GE is formed over the first portion S4a of the fourth nitride semiconductor layer S4 via the gate insulating film GI. The planar shape of the first portion S4a is a rectangular shape having long sides in the Y direction (see FIG. 8). The second portions S4b are provided on both sides of (provided around) the first portion S4a (see FIG. 7).

The planar shape of the laminate of the gate insulating film GI and the gate electrode GE is a rectangular shape having long sides in the Y direction (see FIG. 8). The width Lg (the length in the X direction, the direction in which a current flows from the drain electrode to the source electrode, i.e., the length in the gate length direction) of the gate electrode GE is almost the same as the width (the length in the X direction) of the first portion S4a.

The interlayer insulating film IL1 is formed over the gate electrode GE. This interlayer insulating film IL1 is a laminated film of a lower layer film IL1a and an upper layer film IL1b. The source electrode SE or the drain electrode DE is formed over the second portion S4b of the fourth nitride semiconductor layer S4. The contact hole (coupling hole) C1 is formed, for example, in the interlayer insulating film IL1, and each of the source electrode SE and the drain electrode DE is arranged in and above the contact hole C1. The insulating film IL2 is formed over the source electrode SE and the drain electrode DE. This insulating film IL2 is a laminated film of a lower layer film IL2a and an upper layer film IL2b.

The planar shape of the drain electrode DE is a rectangular shape having long sides in the Y direction, as illustrated in FIG. 8. The planar shape of the source electrode SE is a rectangular shape having long sides in the Y direction. The contact hole C1 to serve as a coupling portion (coupling region) between the drain electrode DE and the fourth nitride semiconductor layer (second portion S4b) S4 is arranged under the drain electrode DE. The planar shape of the contact hole C1 is a rectangular shape having long sides in the Y direction. The contact hole C1 to serve as a coupling portion (coupling region) between the source electrode SE and the fourth nitride semiconductor layer (second portion S4b) S4 is arranged under the source electrode SE. The planar shape of the contact hole C1 is a rectangular shape having long sides in the Y direction.

The gate electrode GE is arranged between the drain electrode DE and the source electrode SE. As described above, the gate electrode GE has a rectangular shape having long sides in the Y direction.

As illustrated in FIG. 8, a plurality of the drain electrodes DE, a plurality of the gate electrodes GE, and a plurality of the source electrodes SE are repeatedly arranged.

That is, the planar shape of the drain electrode DE is a rectangular shape having long sides in the Y direction. The line-shaped drain electrodes DE are arranged at certain intervals in the X direction. The planar shape of the source electrode SE is a rectangular shape having long sides in the Y direction. The line-shaped source electrodes SE are arranged at certain intervals in the X direction. Each of the source electrodes SE and each of the drain electrodes DE are arranged alternately along the X direction. The gate electrode GE is arranged between the contact hole C1 under the drain electrode DE and the contact hole C1 under the source electrode SE.

The drain electrodes DE are coupled by a drain pad (also referred to as a terminal part) DP. The drain pad DP is arranged to extend in the X direction at one end side of the drain electrode DE (e.g., at the upper side in FIG. 8). In other words, the drain electrodes DE are arranged to protrude in the Y direction from the drain pad DP extending in the X direction. Such a shape may be referred to as a comb shape.

The source electrodes SE are coupled by a source pad (also referred to as a terminal part) SP. The source pad SP is arranged to extend in the X direction at the other end side of the source electrode SE (e.g., at the lower side in FIG. 8). In other words, the source electrodes SE are arranged to protrude in the Y direction from the source pad SP extending in the X direction. Such a shape may be referred to as a comb shape.

The gate electrodes GE are coupled by a gate line GL. The gate line GL is arranged to extend in the X direction at one end side of the gate electrode GE (e.g., at the lower side in FIG. 8). In other words, the gate electrodes GE are arranged to protrude in the Y direction from the gate line GL extending in the X direction. The gate line GL is coupled to gate pads GP provided, for example, on both sides, in the X direction, of the gate line GL (e.g., on the right and left sides in FIG. 8).

Herein, the first portion S4a of the fourth nitride semiconductor layer S4 is arranged under the gate electrode GE and the gate line GL via the gate insulating film GI.

The source electrode SE, the drain electrode DE, and the gate electrode GE are arranged mainly over an active region AC surrounded by an element isolation region ISO. The planar shape of the active region AC is a substantially rectangular shape having long sides in the X direction. On the other hand, the drain pad DP, the gate line GL, and the source pad SP are arranged over the element isolation region ISO. The gate line GL is arranged between the active region AC and the source pad SP. The element isolation region ISO is a region in which ion species, such as boron (B) or nitrogen (N), have been implanted by ion implantation or the like and the crystallinity is destroyed in the nitride semiconductor layer.

[Description of Manufacturing Method]

Next, a manufacturing method of a semiconductor device according to the present embodiment will be described and a configuration of the semiconductor device will be made clearer with reference to FIGS. 9 to 20. FIGS. 9 to 20 are sectional views each illustrating a manufacturing step of the semiconductor device according to the embodiment.

Figure 9:
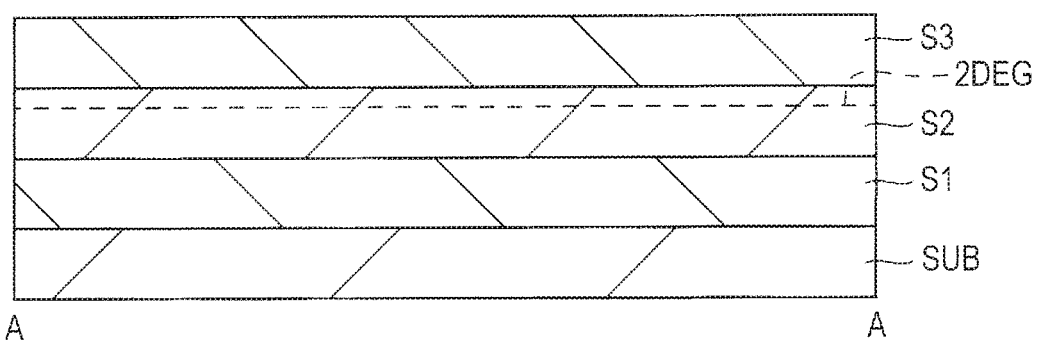
FIG. 9 is a sectional view illustrating a manufacturing step of the semiconductor device according to First Embodiment.

The substrate SUB is provided and the first to third nitride semiconductor layers (S1 to S3) are sequentially formed, as illustrated in FIG. 9. A semiconductor substrate including, for example, silicon (Si) whose (111) plane is exposed is used as the substrate SUB. Besides the above silicon, a substrate including SiC, sapphire, or the like may be used as the substrate SUB. Alternatively, a substrate including GaN may be used. Herein, all of the nitride semiconductor layers (group III-V compound semiconductor layer) to be formed subsequently over the substrate SUB are generally formed by group III element plane growth (i.e., in this case, gallium plane growth or aluminum plane growth). Alternatively, the first to third nitride semiconductor layers (S1 to S3) may be sequentially formed after a nucleation layer and a high-resistance buffer layer are formed over the substrate SUB. As the nucleation layer, for example, an aluminum nitride (AlN) layer can be used, which can be formed by epitaxial growth using, for example, a metal organic chemical vapor deposition (MOCVD) process. As the high-resistance buffer layer, a superlattice structure, in which a laminated film (AlN/GaN film) of a gallium nitride (GaN) layer and an aluminum nitride (AlN) layer is repeatedly laminated, can be used, and this superlattice structure can be formed, for example, by epitaxially growing the gallium nitride (GaN) layer and the aluminum nitride (AlN) layer alternately with the use of a MOCVD process.

Next, an AlGaN layer (Al composition ratio 5%) having a thickness of approximately 1 μm is epitaxially grown, as the first nitride semiconductor layer (buffer layer) S1, over the substrate SUB by using a MOCVD process or the like. When the chemical formula of the AlGaN is represented, for example, by $Al_XGa_{1-X}N$, the constituent element ratio of the AlGaN layer can be adjusted within a range of $0 \leq X \leq 0.1$). When the Al composition ratio is 5%, X=0.05. This AlGaN layer is, for example, a non-doped layer. That is, the AlGaN layer is not intentionally doped with n-type impurities or p-type impurities.

Next, a GaN layer having a thickness of approximately 40 nm is epitaxially grown, as the second nitride semiconductor layer (channel layer) S2, over the first nitride semiconductor layer S1 by using a MOCVD process or the like.

Next, an AlGaN layer (Al composition ratio 22%) having a thickness of approximately 14 nm is epitaxially grown, as the third nitride semiconductor layer (barrier layer) S3, over the second nitride semiconductor layer S2 by using a MOCVD process or the like. When the chemical formula of the AlGaN is represented, for example, by $Al_ZGa_{1-Z}N$, the constituent element ratio of the AlGaN layer can be adjusted within a range of $X<Z<0.3$).

Herein, 2DEG (two-dimensional electron gas) is generated near the interface between the second nitride semiconductor layer (channel layer) S2 and the third nitride semiconductor layer (barrier layer) S3 and on the side of the second nitride semiconductor layer S2, as described above.

Figure 10:
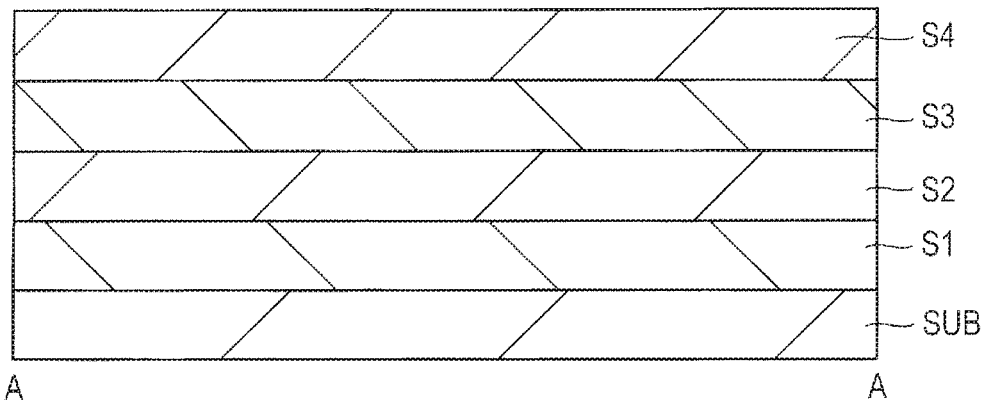
FIG. 10 is a sectional view illustrating a manufacturing step of the semiconductor device according to First Embodiment.

Next, a GaN layer having a thickness of approximately 25 nm is epitaxially grown, as the fourth nitride semiconductor layer S4, over the third nitride semiconductor layer S3 by using a MOCVD process or the like, as illustrated in FIG. 10. The 2DEG is eliminated when the fourth nitride semiconductor layer S4 is formed. In order to exhibit the function of suppressing 2DEG by the fourth nitride semiconductor layer S4, the thickness of the layer S4 is preferably at least 15 nm. The thickness of the fourth nitride semiconductor layer S4 can be adjusted, for example, within the range of 15 nm to 150 nm.

Each of the first to fourth nitride semiconductor layers S1 to S4 is grown while, for example, carrier gas and material gas are being introduced into an apparatus. Gases containing the constituent elements of each of the nitride semiconductor layers (herein, the AlGaN layer and the GaN layer) are used as the material gas. For example, when the AlGaN layer is formed, trimethylaluminum (TMAl), trimethylgallium (TMG), and ammonia are used as the material gases of Al, Ga, and N, respectively. For example, when the GaN layer is formed, trimethylgallium (TMG) and ammonia are used as the material gases of Ga and N, respectively. According to an epitaxial growth process, the component element ratio of each layer can be easily and accurately adjusted by adjusting the flow rates of the material gases, as described above. According to an epitaxial growth process, a layer having a different element composition can also be easily and continuously formed by switching material gases.

Next, the element isolation region (ISO), not appearing in the section illustrated in FIG. 10, is formed (see FIG. 8). For example, the fourth nitride semiconductor layer S4 is covered with a protective film such as an insulating film, and a photoresist film (not illustrated) for opening the element isolation region is formed over the protective film by a photolithography process. Next, the element isolation region (ISO) is formed by implanting boron ions through the protective film with the use of the photoresist film as a mask.

By implanting ion species such as boron (B) or nitrogen (N), as described above, the crystallinity of the nitride semiconductor layer is broken, so that the element isolation region (ISO) is formed.

For example, boron ions are implanted into part of the laminate including the first to fourth nitride semiconductor layers S1 to S4 at a density of approximately $1 \times 10^{14}$ (1E14) to $4 \times 10^{14}$ (1E14) cm$^{-2}$. The implantation energy is, for example, approximately 100 to 200 keV. Herein, the conditions for implanting boron ions are adjusted such that the depth of the implantation, that is, the bottom of the element isolation region (ISO) is located, for example, below the bottom surface of the third nitride semiconductor layer (barrier layer) S3. The element isolation region (ISO) is formed in this way. The region surrounded by the element isolation region (ISO) will serve as the active region AC. The active region AC has a substantially rectangular shape, as illustrated in FIG. 8. Thereafter, the photoresist film is removed by a plasma stripping process or the like, and further the protective film is removed.

Figure 11:
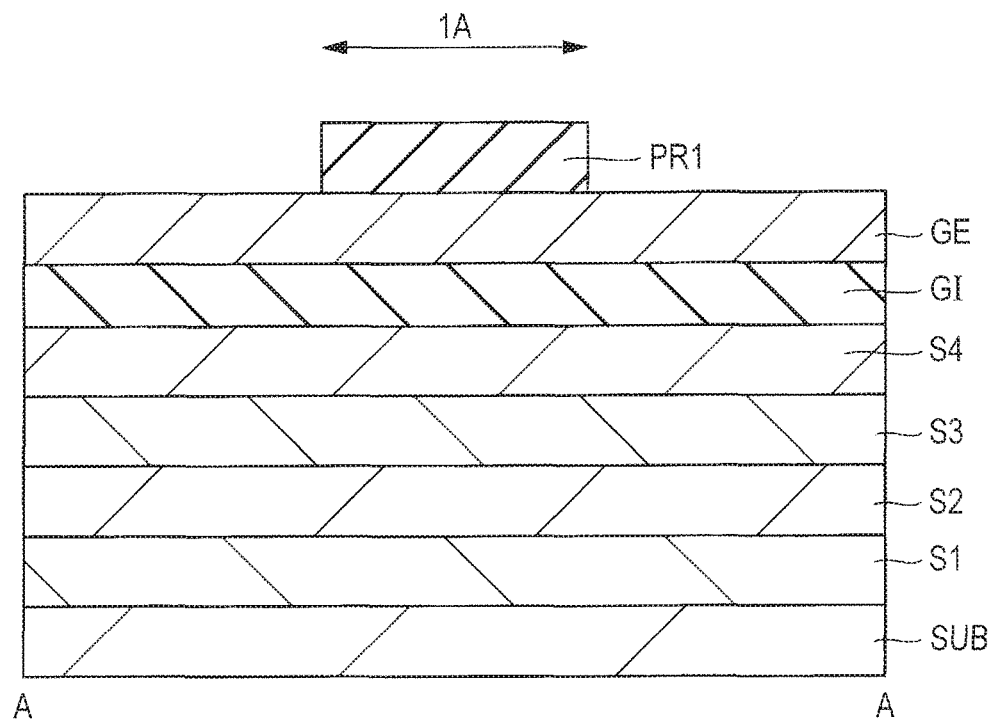
FIG. 11 is a sectional view illustrating a manufacturing step of the semiconductor device according to First Embodiment.

Next, an insulating film to serve as the gate insulating film GI and a conductive film to serve as the gate electrode GE are sequentially formed over the fourth nitride semiconductor layer S4, as illustrated in FIG. 11. For example, an aluminum oxide film ($Al_2O_3$ film) having a thickness of approximately 60 nm is deposited, as an insulating film for the gate insulating film GI, over the fourth nitride semiconductor layer S4 by using an ALD process or the like. Besides an aluminum oxide film, a silicon oxide film or a high dielectric constant film having a higher dielectric constant than a silicon oxide film may be used as the insulating film for the gate insulating film GI. As the high dielectric constant film, an SiN film, SiON film (silicon oxynitride film), $ZrO_2$ film (zirconium oxide film), or hafnium-based insulating film, such as $HfO_2$ film (hafnium oxide film), hafnium aluminate film, HfON film (hafnium oxynitride film), HfSiO film (hafnium silicate film), HfSiON film (hafnium silicon oxynitride film), or a HfAlO film, may be used.

Next, for example, a TiN (titanium nitride) film having a thickness of approximately 100 nm is deposited, as a conductive film for the gate electrode GE, over the insulating film for the gate insulating film GI by using, for example, a sputtering process or the like. The constituent materials and thickness of the conductive film can be appropriately adjusted. Besides TiN, polycrystalline silicon doped with a dopant, such as B or P, may be used as the conductive film for the gate electrode GE. Alternatively, Ti, Al, Ni, Pt, Au, and Si compounds or N compounds thereof may be used. Alternatively, a multilayer film in which these material films are laminated may be used. For example, a film in which an Au film is laminated over the Ni film may be used as the conductive film.

Figure 12:
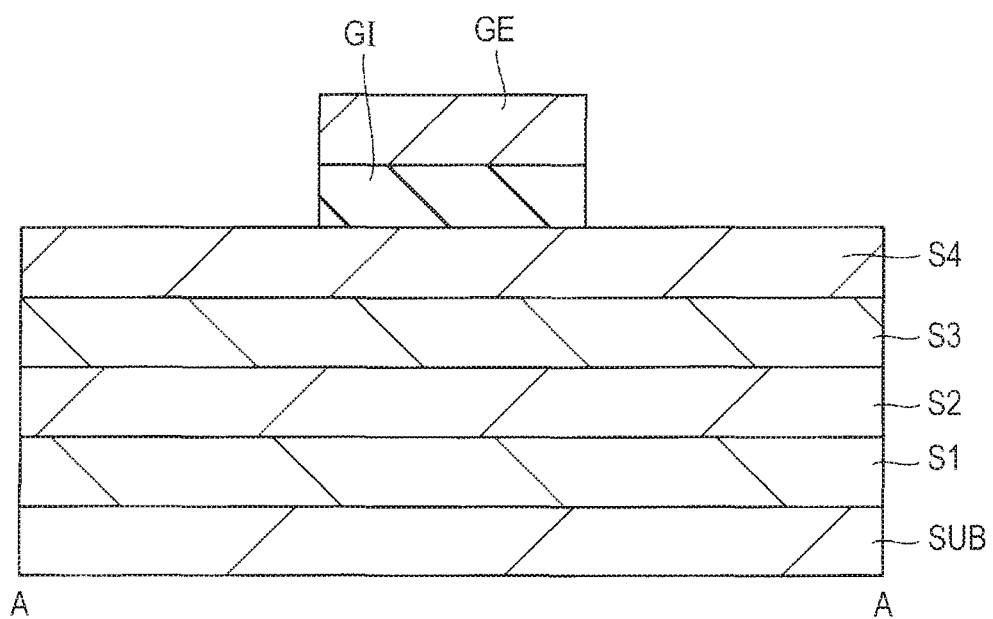
FIG. 12 is a sectional view illustrating a manufacturing step of the semiconductor device according to First Embodiment.

Next, a photoresist film PR1 is formed in the region (the first region 1A) where the gate electrode GE is to be formed, the region being located over the conductive film for the gate electrode GE, by a photolithography process. The conductive film for the gate electrode GE and the insulating film for the gate insulating film GI are etched by using the photoresist film PR1 as a mask. The TiN film and the aluminum oxide film are etched by dry etching using, for example, chlorine-based gas. The aluminum oxide film may be removed by wet etching using a phosphoric acid-based etchant. Herein, a patterned insulating film (e.g., a silicon oxide film) or the like may be used as the mask. Thereafter, the photoresist film PR1 is removed by a plasma stripping process or the like. Thereby, the gate electrode GE is formed over the fourth nitride semiconductor layer S4 via the gate insulating film GI, as illustrated in FIG. 12.

Figure 13:
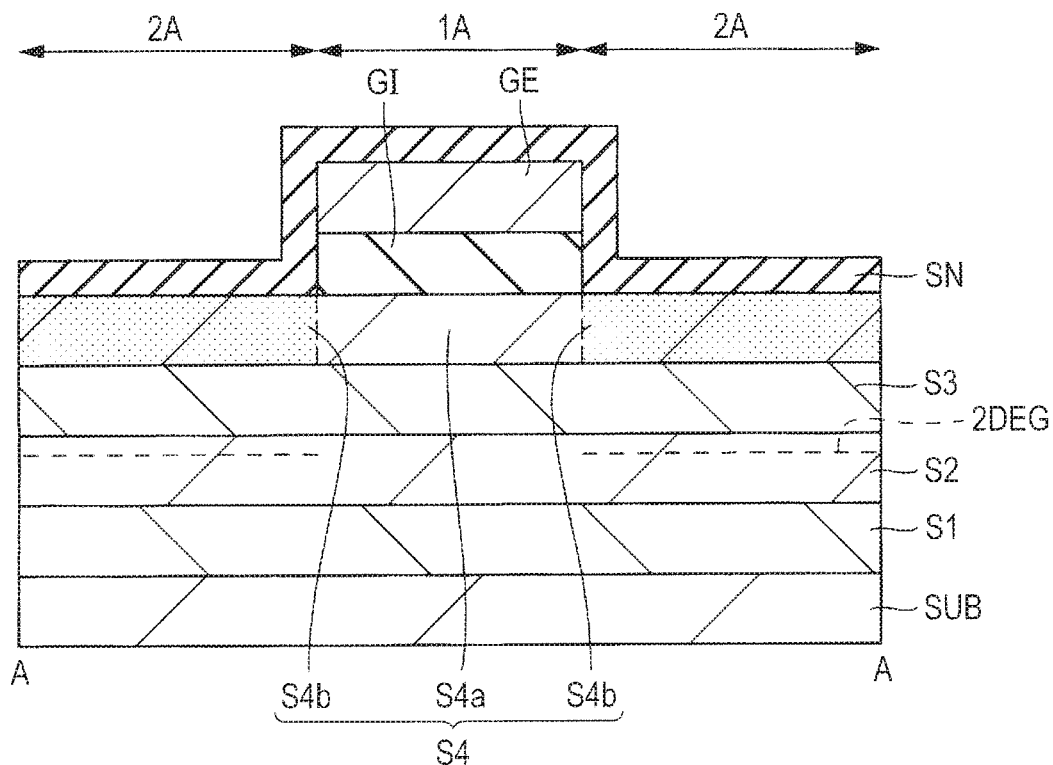
FIG. 13 is a sectional view illustrating a manufacturing step of the semiconductor device according to First Embodiment.
Figure 14:
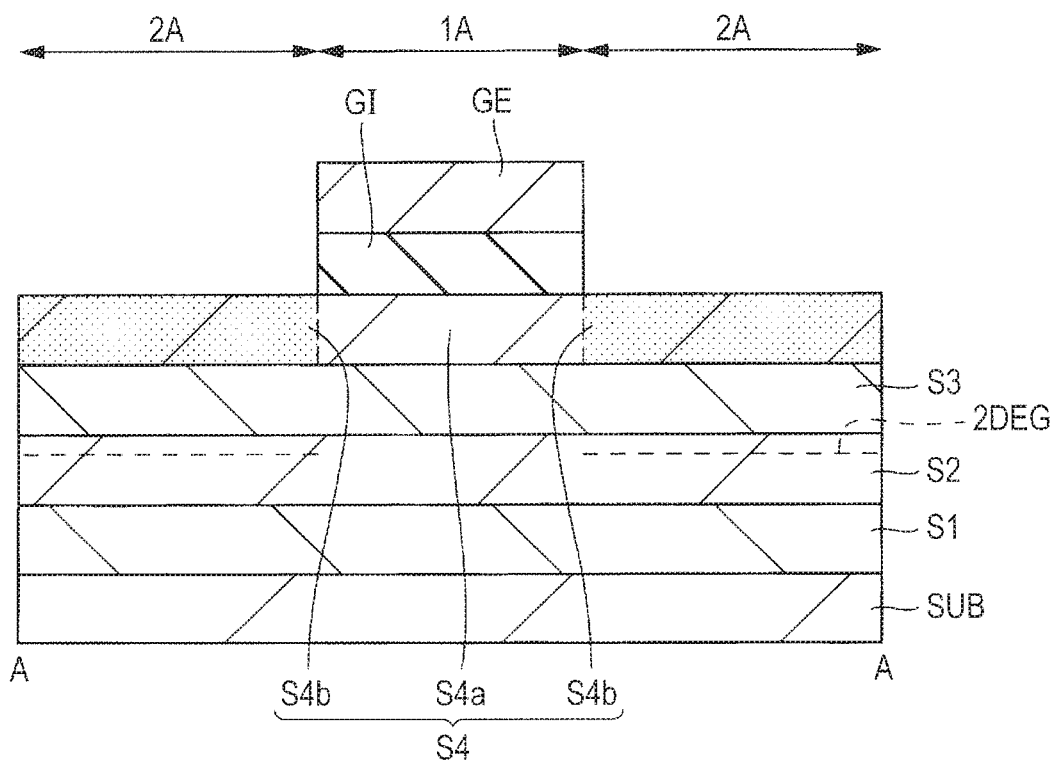
FIG. 14 is a sectional view illustrating a manufacturing step of the semiconductor device according to First Embodiment.

Next, the silicon nitride film SN having a thickness of approximately 90 nm is deposited over the fourth nitride semiconductor layer S4 including over the gate electrode GE by using a plasma CVD process or the like, as illustrated in FIG. 13. Thereby, the first portion (silicon nitride non-contact portion) S4$a$, including the fourth nitride semiconductor layer S4 that is not in contact with the silicon nitride film SN, is formed under the gate electrode GE, and the second portions (silicon nitride contact portions) S4$b$ are formed on both sides thereof (in the second regions 2A). That is, the function of suppressing 2DEG of the fourth nitride semiconductor layer S4 is lost by the contact with the silicon nitride film SN, and 2DEG is restored in the contact region between the silicon nitride film SN and the fourth nitride semiconductor layer S4. Next, the silicon nitride film SN is removed by etching, as illustrated in FIG. 14. Herein, the lowering in the function of suppressing 2DEG of the fourth nitride semiconductor layer S4 is maintained even after the silicon nitride film SN is removed, and the generated 2DEG remains under the second portion S4$b$. The thickness of the silicon nitride film SN to be used for the above processing is preferably more than 45 nm, and more preferably 90 nm or more, and hence the thickness can be adjusted within the range of, for example, 50 nm to 150 nm.

Figure 15:
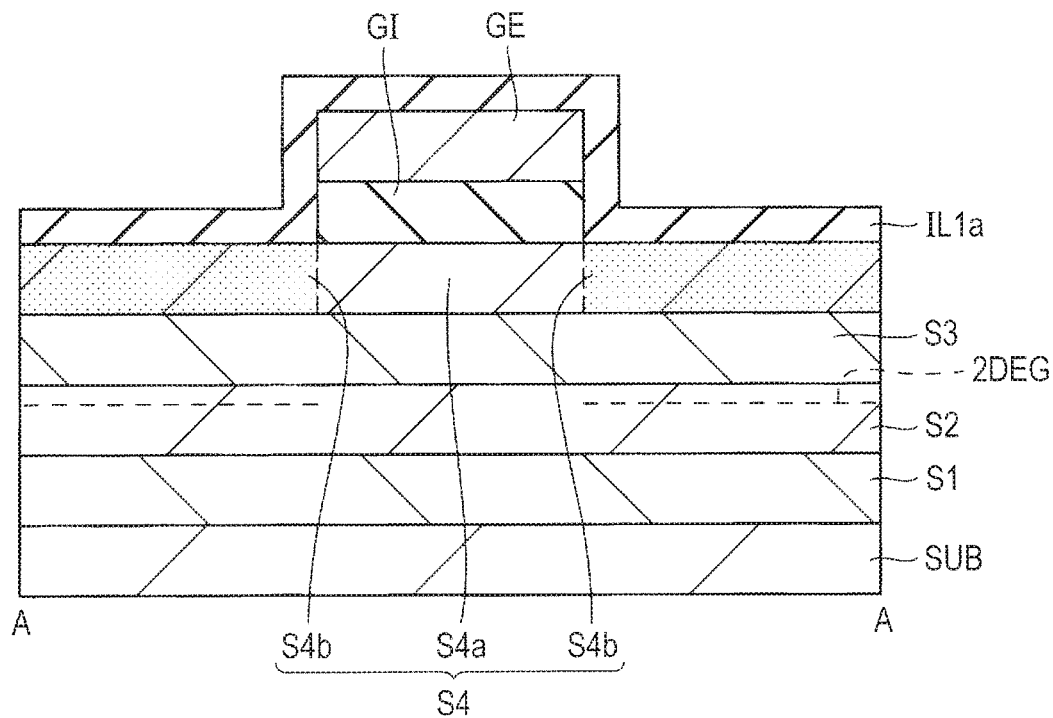
FIG. 15 is a sectional view illustrating a manufacturing step of the semiconductor device according to First Embodiment.
Figure 16:
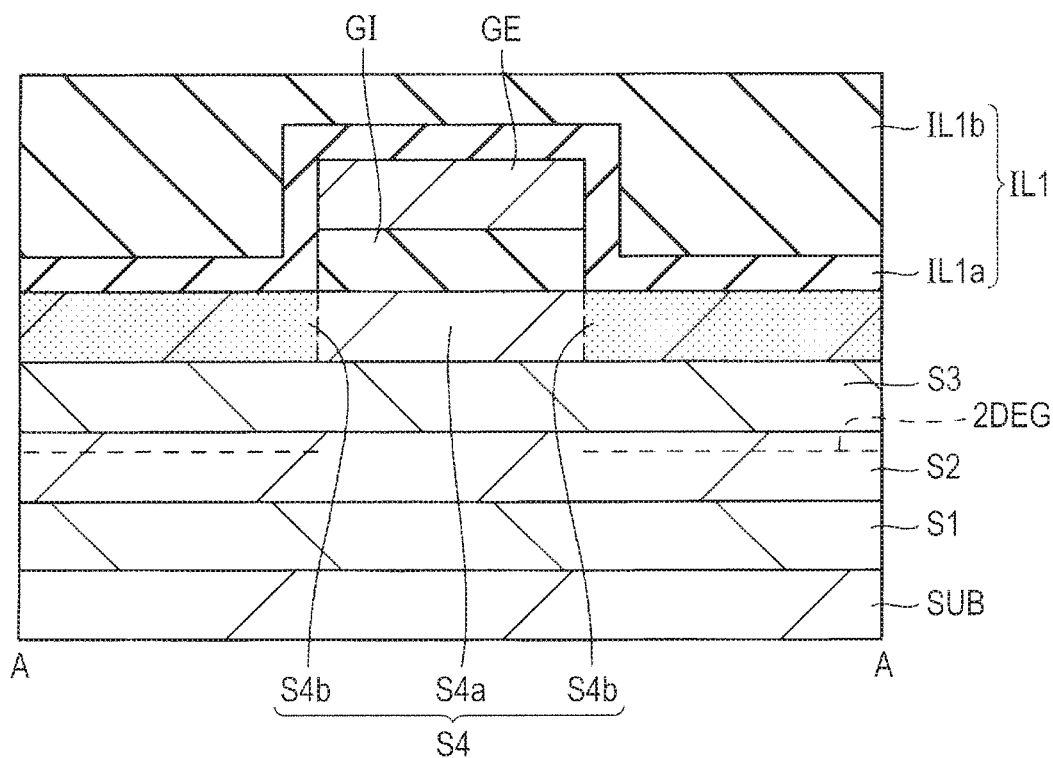
FIG. 16 is a sectional view illustrating a manufacturing step of the semiconductor device according to First Embodiment.

Next, the interlayer insulating film IL1 is formed over the gate electrode GE, as illustrated in FIGS. 15 and 16. For example, a silicon nitride film having a thickness of approximately 100 nm is deposited as the lower layer film (IL1$a$) of the interlayer insulating film IL1 by using a CVD process or the like (FIG. 15). Next, a silicon oxide film having a thickness of approximately 1 µm is deposited, as the upper layer film (IL1$b$), over the silicon nitride film by using a CVD process or the like (FIG. 16). Herein, the interlayer insulating film IL1 may include only the silicon oxide film, in which the silicon nitride film is not formed. As the silicon oxide film, a so-called TEOS film using tetraethyl orthosilicate as a material may also be used.

Figure 17:
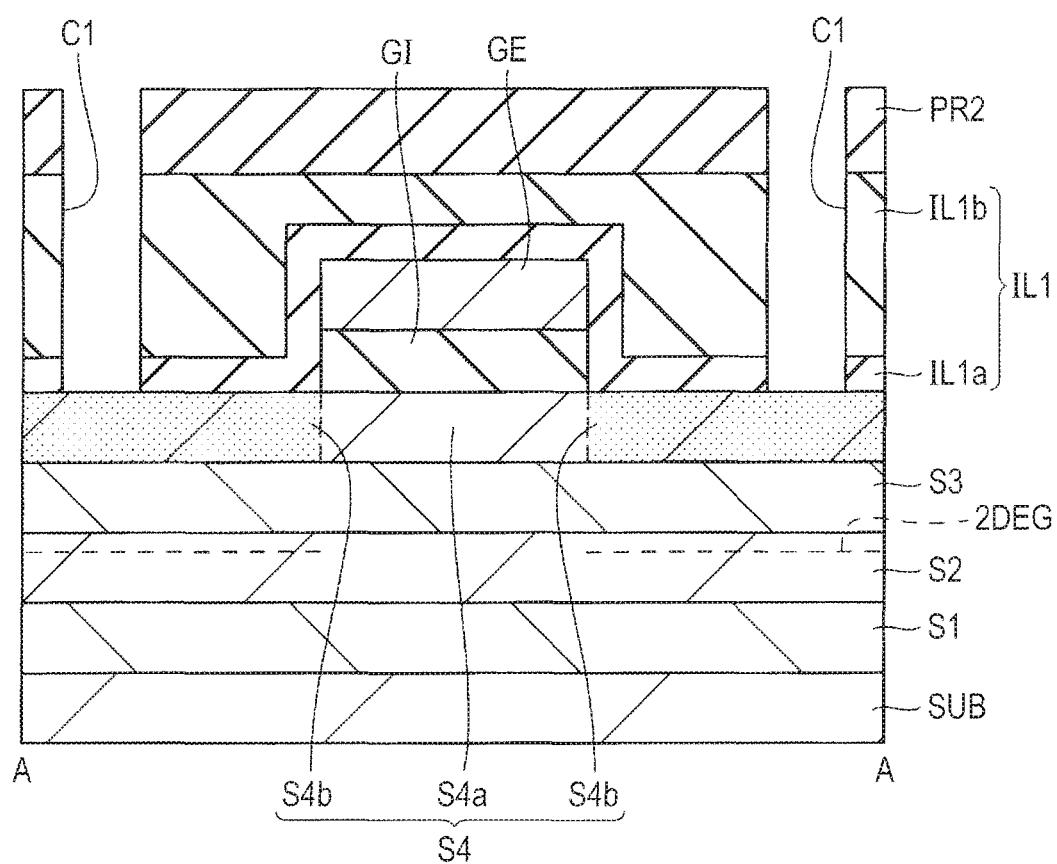
FIG. 17 is a sectional view illustrating a manufacturing step of the semiconductor device according to First Embodiment.

Next, the contact hole C1 is formed in the interlayer insulating film IL1 by using a photolithography technique and an etching technique, as illustrated in FIG. 17. For example, a photoresist film PR2 respectively having openings in a source electrode coupling region and a drain electrode coupling region is formed over the interlayer insulating film IL1. Next, the contact hole C1 is formed by etching the interlayer insulating film IL1 with the use of the photoresist film PR2 as a mask. Herein, the silicon nitride film formed as the lower layer film (IL1$a$) functions as an etching stopper in the above etching. Therefore, as the lower layer film (IL1$a$), a film other than the silicon nitride film (e.g., a silicon oxide film formed in a way different from that of the upper layer film) may be used as long as an etching selection ratio to the upper layer film (IL1$b$) is secured. That is, etching is performed under the conditions in which the upper layer film IL1$b$ is preferentially etched, and when the lower layer film IL1$a$ is exposed, etching is performed under the conditions in which the lower layer film IL1$a$ is preferentially etched. Thereby, the contact hole C1 can be formed accurately. By this etching, the second portion S4$b$ of the fourth nitride semiconductor layer S4 is exposed at the bottom surface of the contact hole C1. Thereafter, the photoresist film PR 2 is removed by a plasma stripping process or the like.

Figure 18:
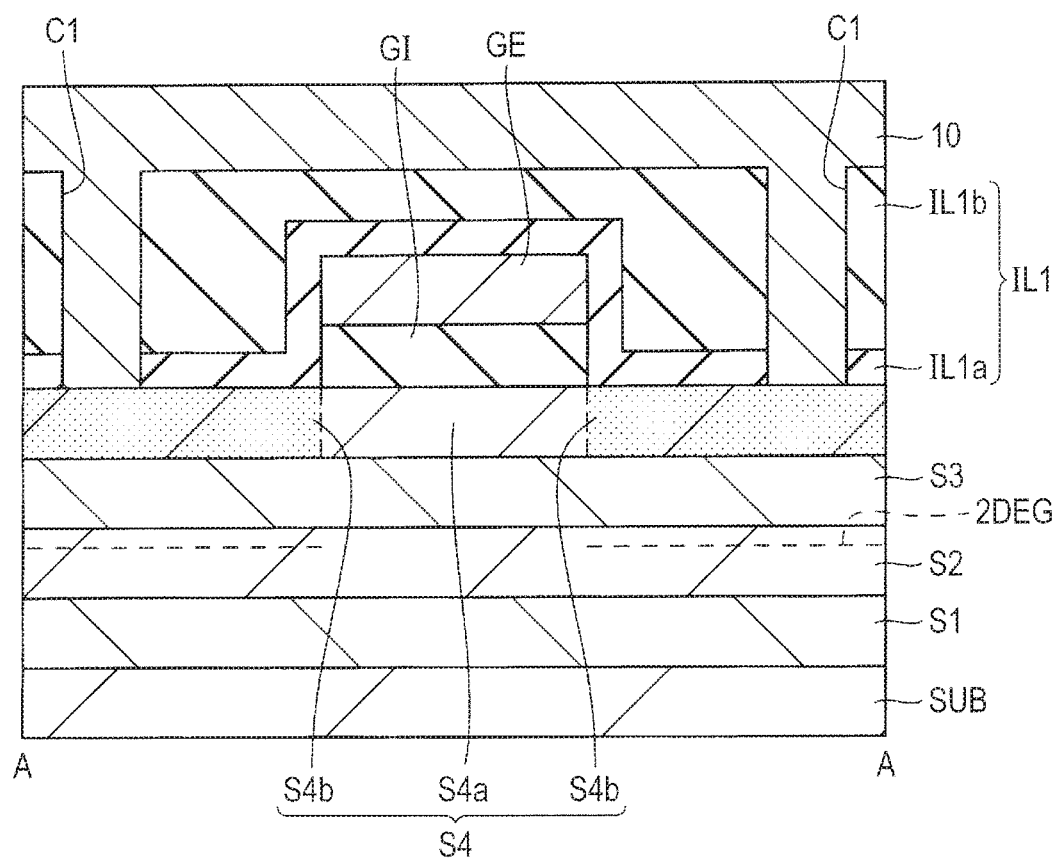
FIG. 18 is a sectional view illustrating a manufacturing step of the semiconductor device according to First Embodiment.
Figure 19:
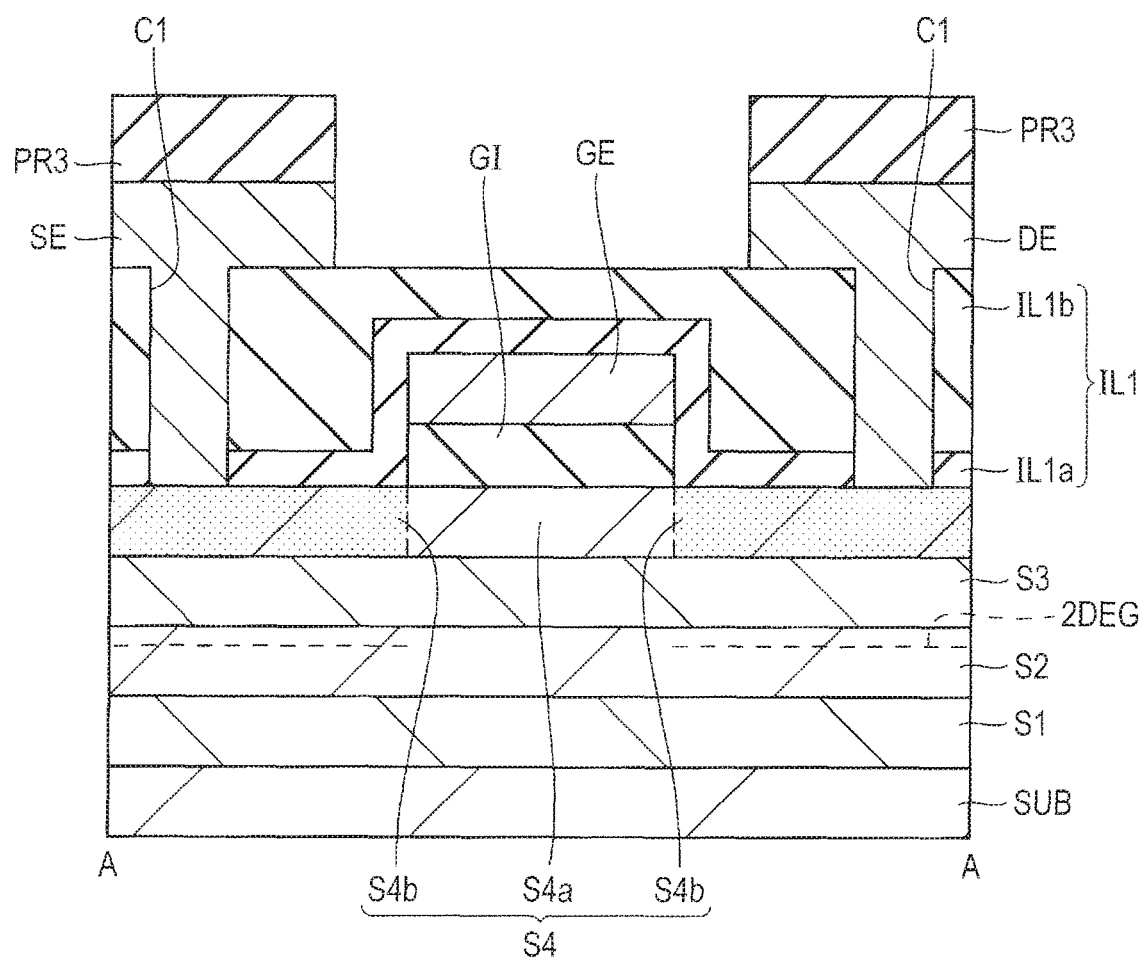
FIG. 19 is a sectional view illustrating a manufacturing step of the semiconductor device according to First Embodiment.

Next, each of the source electrode SE and the drain electrode DE is formed in the contact hole C1 and over the interlayer insulating film IL1, as illustrated in FIGS. 18 and 19. For example, a conductive film 10 is formed over the interlayer insulating film IL1 including the inside of the contact hole C1, as illustrated in FIG. 18. For example, an Al/Ti film is formed as the conductive film 10. For example, a Ti film having a thickness of approximately 16 nm is formed over the interlayer insulating film IL1 including the inside of the contact hole C1 by using a sputtering process or the like, and further an Al film having a thickness of approximately 2 μm is formed thereover by using a sputtering process or the like. Next, a heat treatment is performed. The heat treatment is performed, for example, at 550° C. for 30 minutes. Thereby, an ohmic contact between the conductive film (Al/Ti film) 10 and the layer located thereunder can be achieved.

Next, a photoresist film PR3 is formed over the regions of the conductive film (Al/Ti film) in which the source electrode SE and the drain electrode DE are to be formed, respectively, and the conductive film (Al/Ti film) 10 is etched by using the photoresist film PR 3 as a mask, as illustrated in FIG. 19. The conductive film (Al/Ti film) 10 is etched, for example, by dry etching using gas containing $Cl_2$ as a main component. Thereby, the source electrode SE and the drain electrode DE can be formed. Alternatively, a heat treatment may be performed after the conductive film (Al/Ti film) 10 is patterned.

The constituent materials and thickness of the conductive film that forms the source electrode SE and the drain electrode DE can be appropriately adjusted. As such a conductive film, a material that can be brought into ohmic contact with a nitride semiconductor layer is preferably used.

Figure 20:
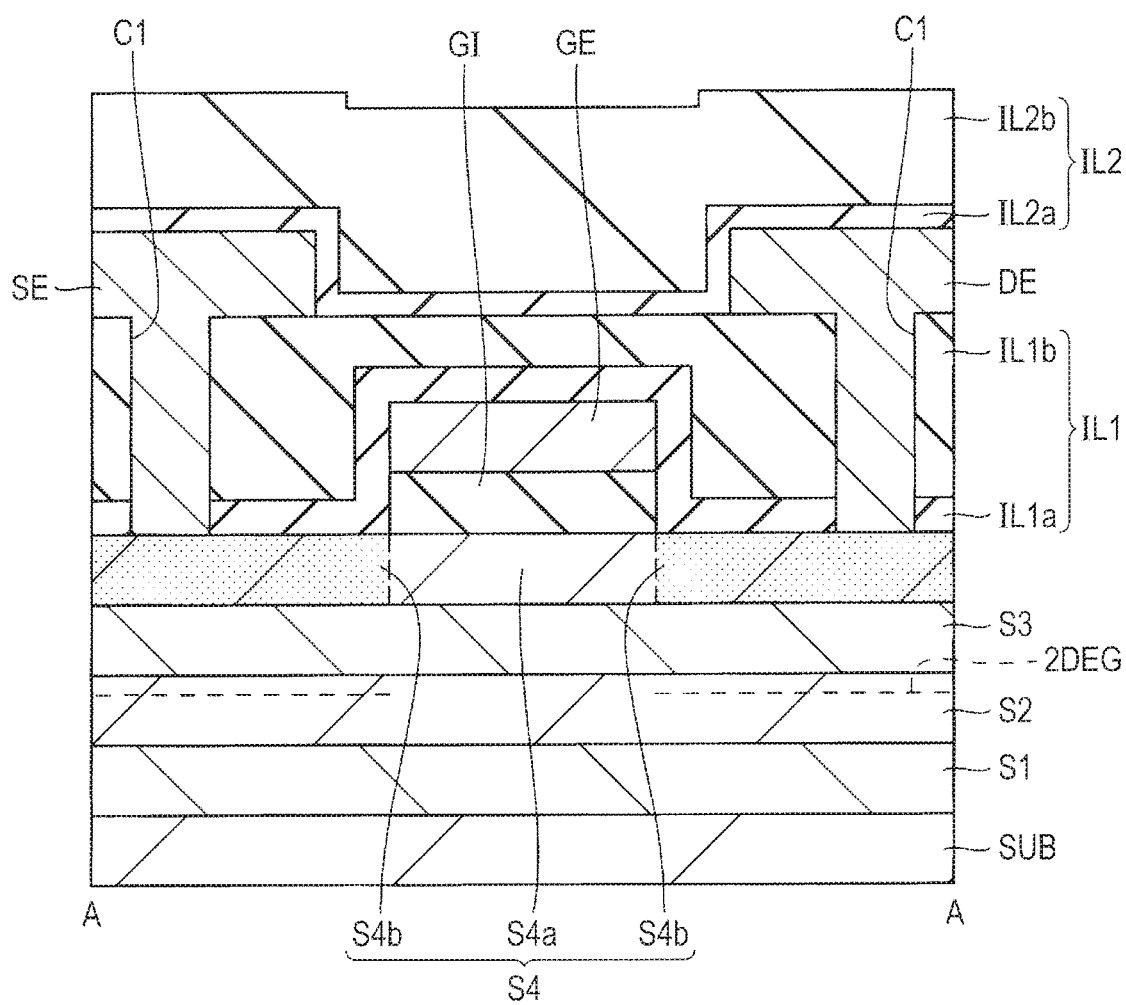
FIG. 20 is a sectional view illustrating a manufacturing step of the semiconductor device according to First Embodiment 1.

Thereafter, the photoresist film PR3 is removed by a plasma stripping process or the like, and then the insulating film (protective film) IL2 is formed over the interlayer insulating film IL1 including over the source electrode SE and over the drain electrode DE. For example, a silicon nitride film having a thickness of approximately 100 nm is deposited as the lower layer film (also referred to as a passivation film) IL2a of the insulating film (protective film) IL2 by using a CVD process or the like, as illustrated in FIG. 20. Next, a polyimide film having a thickness of approximately 7 μm is deposited, as the upper layer film IL2b, over the silicon nitride film by using a coating process or the like.

Herein, an insulating film (protective film) having the above polyimide film or the like may be formed over the uppermost layer wiring after multilayer wiring to be coupled to the source electrode SE and the drain electrode DE is formed. Thereafter, the insulating film (laminated film of the polyimide film and the silicon nitride film) is removed to expose part of the lower conductive film (wiring) in regions where the gate pad GP, the source pad SP, the drain pad DP, and the like (see FIG. 8) need to be electrically coupled to the outside, whereby pad portions (not illustrated) are formed.

The semiconductor device according to the present embodiment can be formed through the above steps. Herein, the above steps are merely one example, and the semiconductor device according to the embodiment may be manufactured by steps other than the above steps.

Second Embodiment

In First Embodiment, the insulating film for the gate insulating film GI and the conductive film for the gate electrode GE are etched at once, but these films may be etched in different steps. Then, a field plate insulating film may be arranged below the end portion of the gate electrode GE.

[Structure Description]

Figure 21:
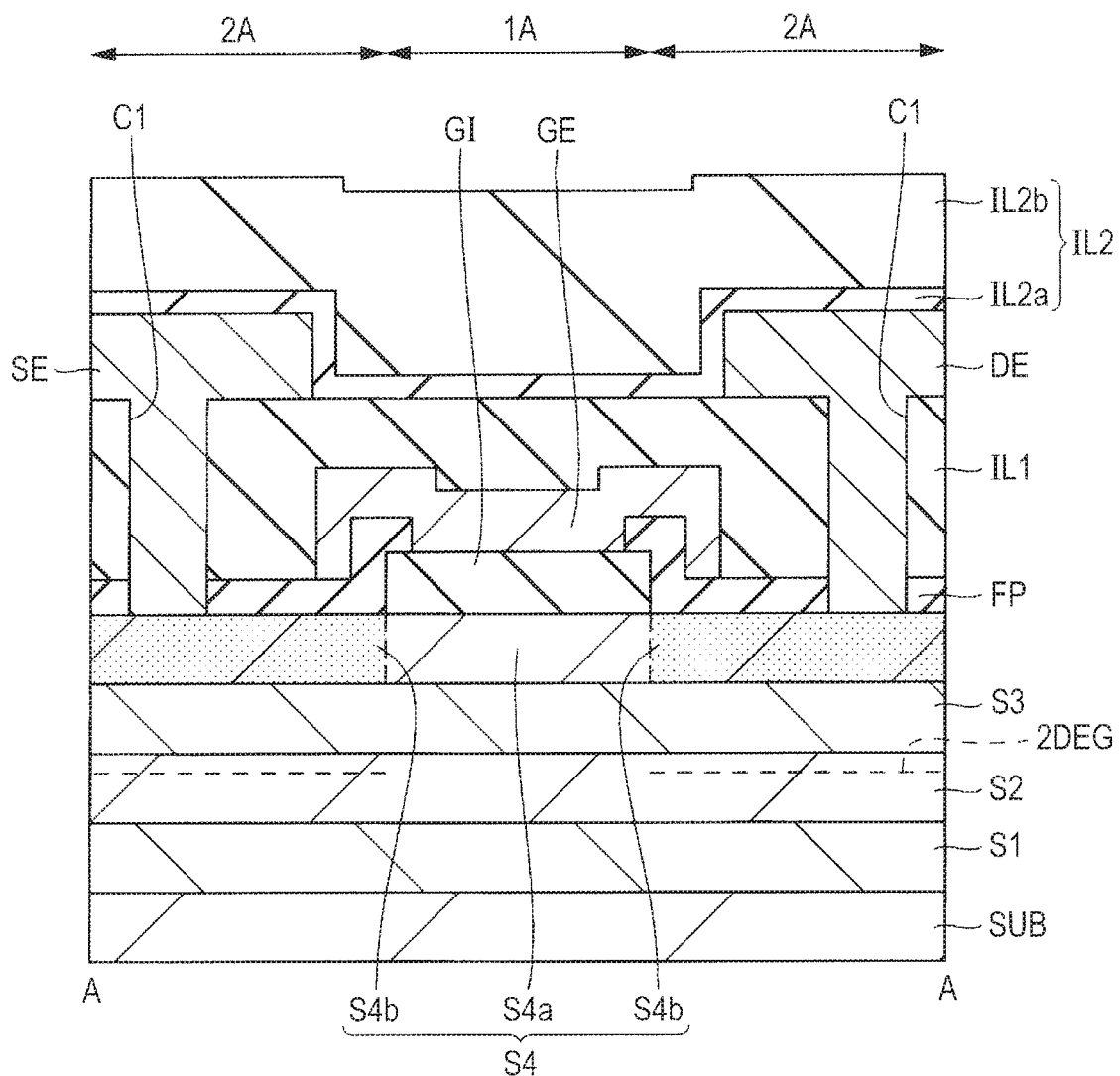
FIG. 21 is a sectional view illustrating a configuration of a semiconductor device according to Second Embodiment.

FIG. 21 is a sectional view illustrating a configuration of a semiconductor device according to the present embodiment. As illustrated in FIG. 21, the configurations of the semiconductor device according to the embodiment are the same as those of the semiconductor device illustrated in First Embodiment (FIG. 7) except that a field plate insulating film FP is formed below the end portion of the gate electrode GE, and hence the description thereof will be omitted.

The semiconductor device according to the present embodiment includes the field plate insulating film FP that is formed over the gate insulating film GI and the second portion S4b of the fourth nitride semiconductor layer S4 and has an opening over the gate insulating film GI. And, the semiconductor device includes a gate electrode GE provided so as to cover the opening of the field plate insulating film FP. The width (the length in the X direction) of the opening is smaller than the width (the length in the X direction) of the gate electrode GE (see FIG. 28). Therefore, the field plate insulating film FP is arranged below the end portion of the gate electrode GE, whereby the breakdown voltage of the semiconductor device can be improved. The field plate insulating film FP includes, for example, a silicon nitride film.

Also in the present embodiment, the first portion (silicon nitride non-contact portion) S4a is arranged under the gate insulating film GI, and the second portions (silicon nitride contact portions) S4b are arranged on both sides thereof.

Therefore, the semiconductor device according to the present embodiment serves as a transistor having a "planar structure" in which a mesa portion is not formed, and a failure caused by a damage during processing of the mesa portion described in First Embodiment can be eliminated, whereby the characteristics of the semiconductor device can be improved.

Further, the field plate insulating film FP is provided below the end portion of the gate electrode GE in the semiconductor device according to the present embodiment, and hence the breakdown voltage of the semiconductor device can be improved.

[Description of Manufacturing Method]

Next, a manufacturing method of the semiconductor device according to the present embodiment will be described and a configuration of the semiconductor device will be made clearer with reference to FIGS. 22 to 33. FIGS. 22 to 33 are sectional views each illustrating a manufacturing step of the semiconductor device according to the embodiment. Herein, the description of the steps similar to those in First Embodiment will be omitted.

First, the substrate SUB over which the first to fourth nitride semiconductor layers (S1 to S4) described in First Embodiment are sequentially formed is provided (see FIGS. 9 and 10). Next, the element isolation region (ISO) is formed in the same way as in First embodiment (see FIG. 8). Herein, the element isolation region (ISO) does not appear in the sections illustrated in the later-described FIG. 22 and the like.

Figure 22:
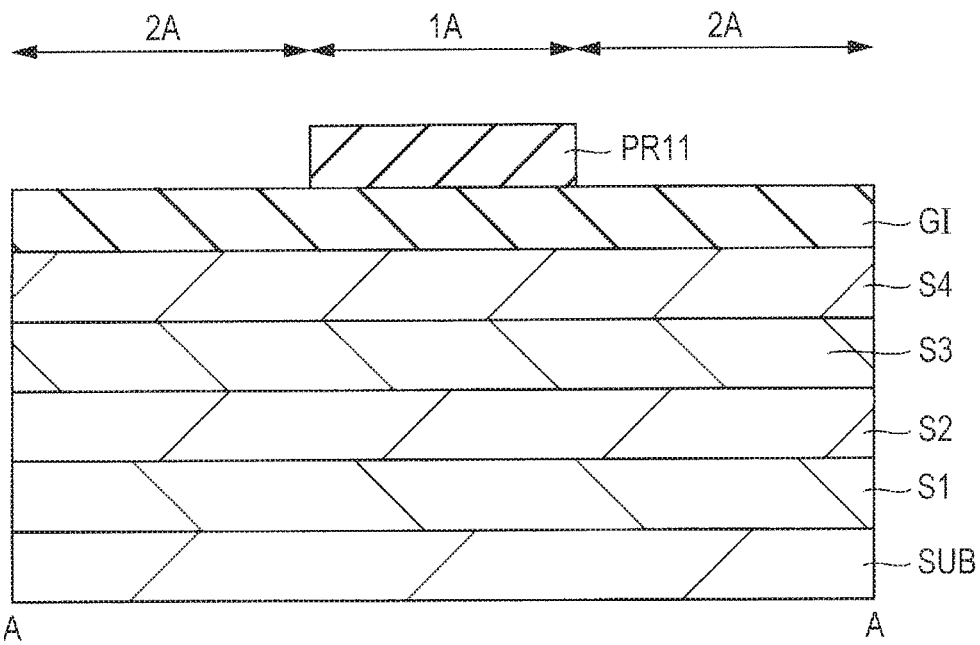
FIG. 22 is a sectional view illustrating a manufacturing step of the semiconductor device according to Second Embodiment.

Next, an aluminum oxide film ($Al_2O_3$ film) having a thickness of approximately 60 nm is deposited, as an insulating film for the gate insulating film GI, over the fourth nitride semiconductor layer S4 by using an ALD process or the like in the same way as in First Embodiment, as illustrated in FIG. 22. Next, a photoresist film PR11 is formed in the first region 1A over the insulating film for the gate insulating film GI by a photolithography process. In the present embodiment, a region where the gate insulating film GI is to be formed serves as the first region 1A, and the regions on both sides thereof serve as second regions 2A. The insulating film for the gate insulating film GI is etched by using the photoresist film PR11 as a mask. Alternatively, a patterned insulating film (e.g., a silicon oxide film) or the like may be used as the mask. Thereafter, the photoresist film PR11 is removed by a plasma stripping process or the like. Thereby, the gate insulating film GI is formed over the fourth nitride semiconductor layer S4. The width (the length in the X direction) of the gate insulating film GI is set to "L1."

Figure 23:
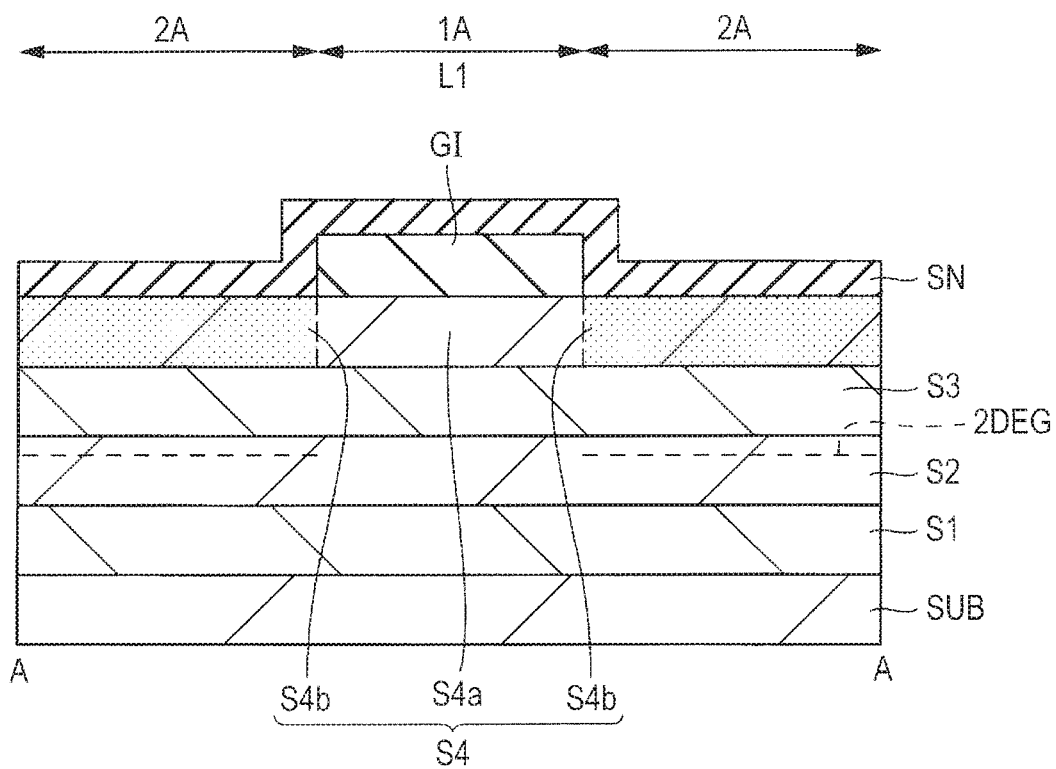
FIG. 23 is a sectional view illustrating a manufacturing step of the semiconductor device according to Second Embodiment.

Next, a silicon nitride film SN having a thickness of approximately 90 nm is deposited over the fourth nitride semiconductor layer S4 including over the gate insulating film GI by using a plasma CVD process or the like, as illustrated in FIG. 23. Thereby, a first portion (silicon nitride non-contact portion) S4$a$ including the fourth nitride semiconductor layer S4 that is not in contact with the silicon nitride film SN, the portion being located under the gate insulating film GI, is formed, and second portions (silicon nitride contact portions) S4$b$ are formed on both sides thereof. That is, the function of suppressing 2DEG of the fourth nitride semiconductor layer S4 is lost by the contact with the silicon nitride film SN, and hence 2DEG is restored in the contact region between the silicon nitride film SN and the fourth nitride semiconductor layer S4.

Figure 24:
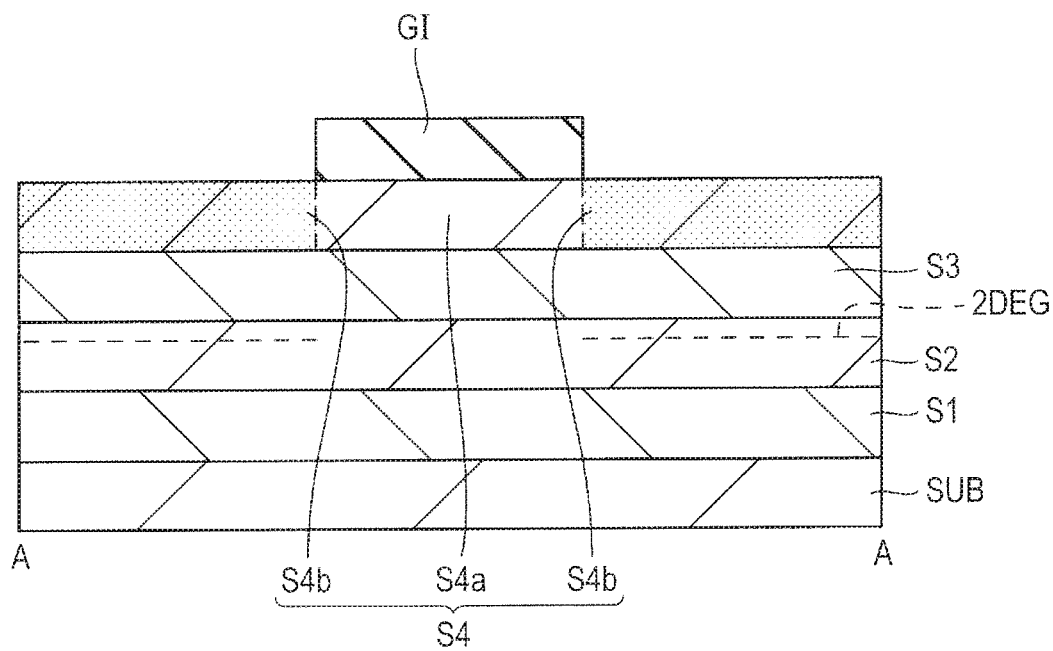
FIG. 24 is a sectional view illustrating a manufacturing step of the semiconductor device according to Second Embodiment.

Next, the silicon nitride film SN is removed by etching, as illustrated in FIG. 24. Herein, the lowering in the function of suppressing 2DEG of the fourth nitride semiconductor layer S4 is maintained even after the silicon nitride film SN is removed, and the generated 2DEG remains under the second portions S4$b$.

Figure 25:
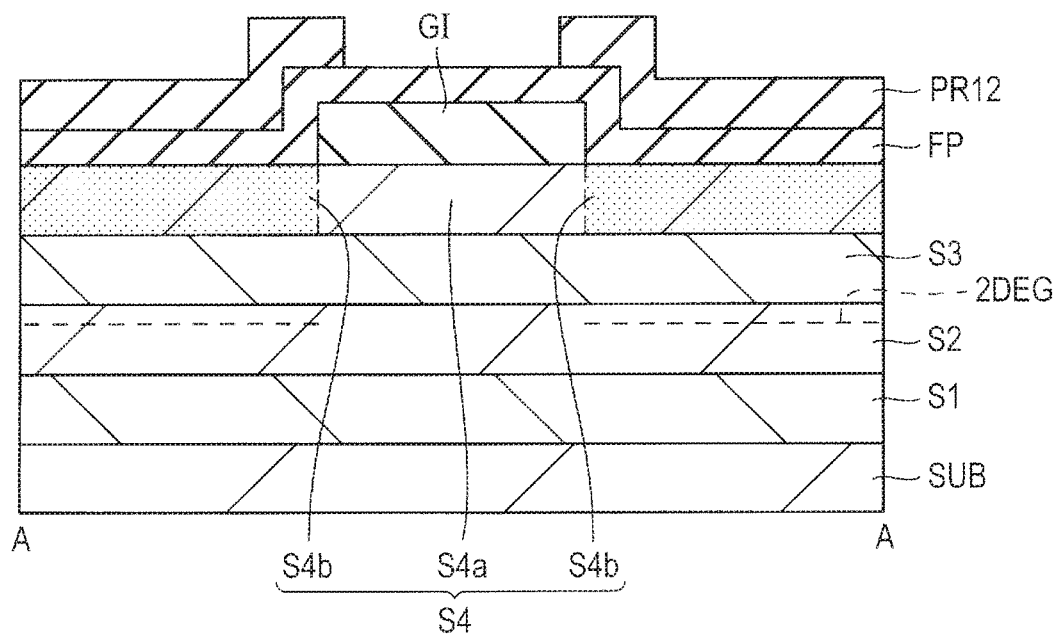
FIG. 25 is a sectional view illustrating a manufacturing step of the semiconductor device according to Second Embodiment.
Figure 26:
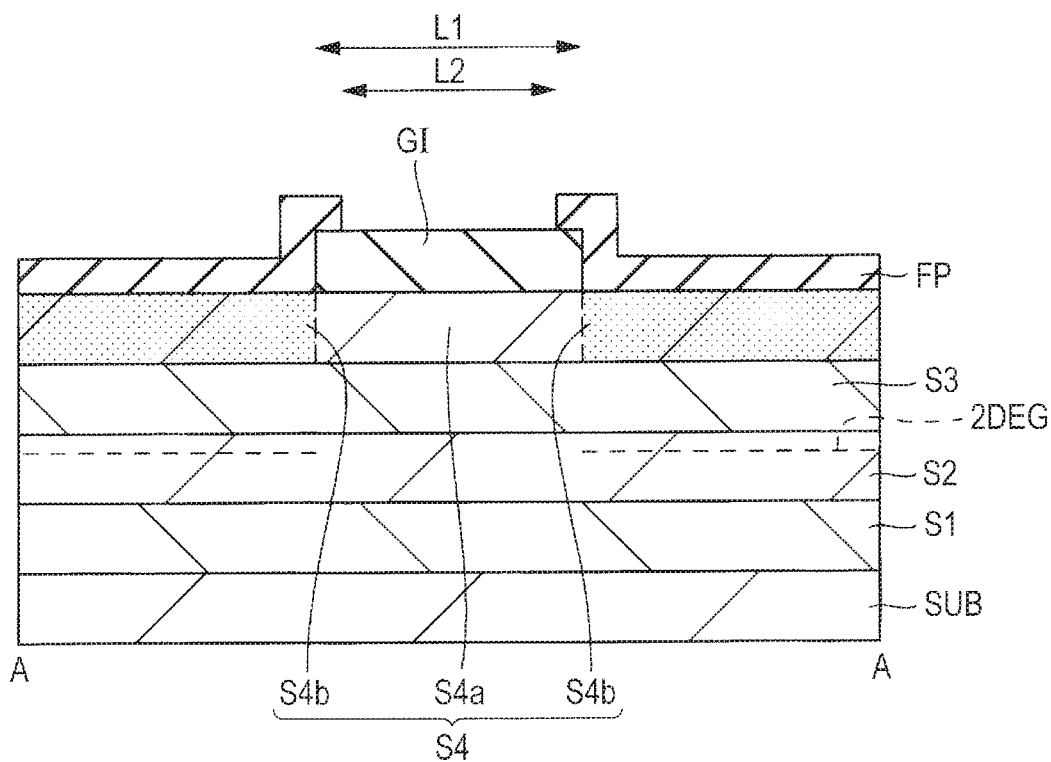
FIG. 26 is a sectional view illustrating a manufacturing step of the semiconductor device according to Second Embodiment.

Next, the field plate insulating film FP is formed over the gate insulating film GI, as illustrated in FIGS. 25 and 26. For example, a silicon nitride film having a thickness of approximately 90 nm is deposited as a film for the field plate insulating film FP by using a CVD process or the like, as illustrated in FIG. 25. Next, a photoresist film PR12 having an opening over the gate insulating film GI is formed over the silicon nitride film. The film for the field plate insulating film FP is etched by using the photoresist film PR12 as a mask. The film for the field plate insulating film FP is etched, for example, by wet etching using a hydrofluoric acid-based etchant. Thereafter, the photoresist film PR12 is removed by a plasma stripping process or the like. Thereby, the field plate insulating film FP having an opening over the gate insulating film GI can be formed as illustrated in FIG. 26. When the width (the length in the X direction) of the opening is set to "L2", there is a relationship of L2<L1.

Figure 27:
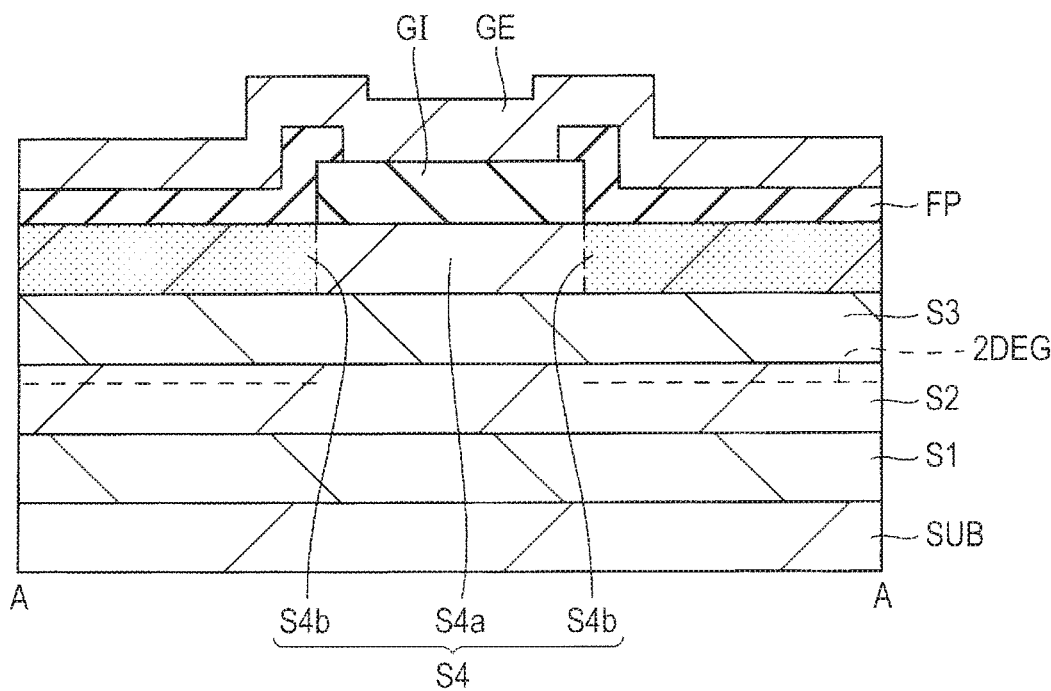
FIG. 27 is a sectional view illustrating a manufacturing step of the semiconductor device according to Second Embodiment.

Next, a conductive film to serve as the gate electrode GE is formed over the gate insulating film GI and the field plate insulating film FP, as illustrated in FIG. 27. For example, a TiN (titanium nitride) film having a thickness of approximately 100 nm is deposited, as a conductive film for the gate electrode GE, over the gate insulating film GI and the field plate insulating film FP by using, for example, a sputtering process or the like. As described in First Embodiment, the constituent materials and thickness of the conductive film can be appropriately adjusted.

Figure 28:
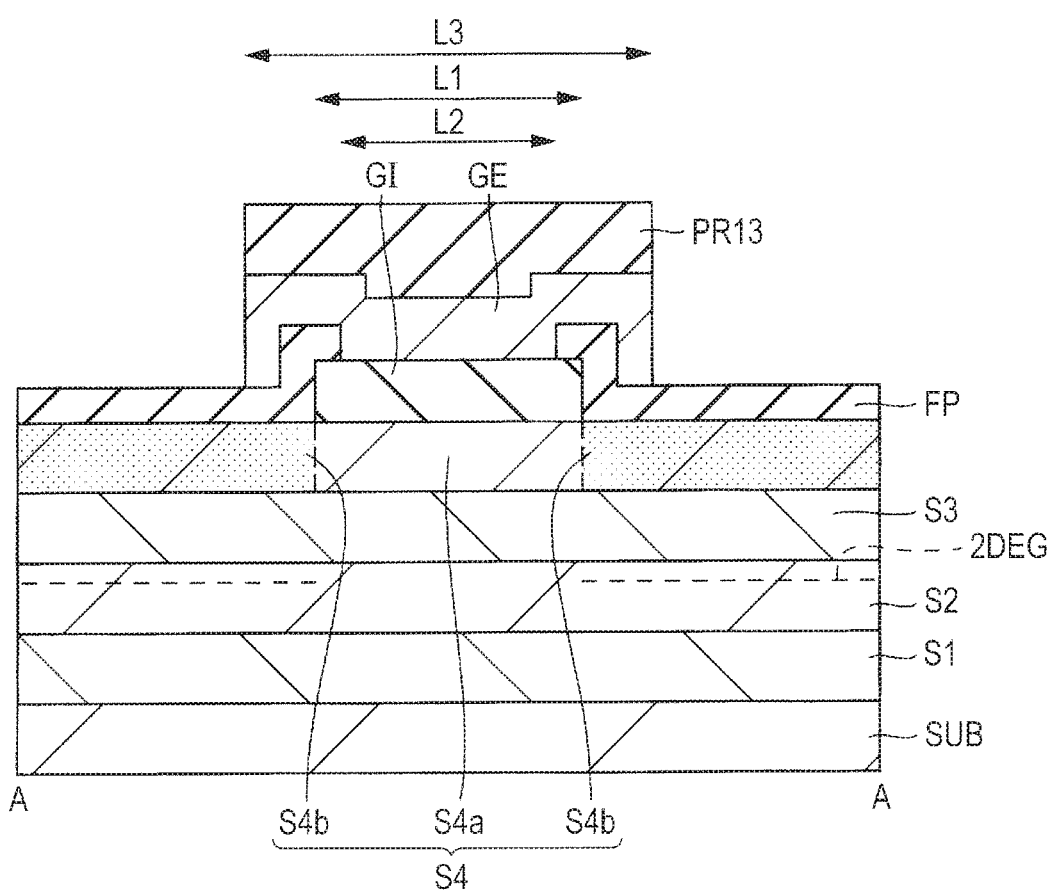
FIG. 28 is a sectional view illustrating a manufacturing step of the semiconductor device according to Second Embodiment.

Next, a photoresist film PR13 is formed in a region where the gate electrode GE is to be formed, the region being located over the conductive film for the gate electrode GE, by a photolithography process, and the conductive film for the gate electrode GE is etched by using the photoresist film PR13 as a mask, as illustrated in FIG. 28. Alternatively, a patterned insulating film (e.g., a silicon oxide film) or the like may be used as the mask. Thereby, the gate electrode GE is formed over the gate insulating film GI. When the width (the length in the X direction) of the gate electrode GE is set to "L3", there is a relationship of L1<L3. Because the width (L3) of the gate electrode GE is larger than the width (L1) of the gate insulating film GI, as described above, the end portion (field plate) of the gate electrode GE is located over the field plate insulating film FP. With such a configuration, an electric field is dispersed to the end portion of the gate insulating film GI and that of the gate electrode GE, so that the electric field to be applied to the end portion of the gate insulating film GI is relaxed, whereby the breakdown voltage of the semiconductor device can be improved. Thereafter, the photoresist film PR13 is removed by a plasma stripping process or the like.

Figure 29:
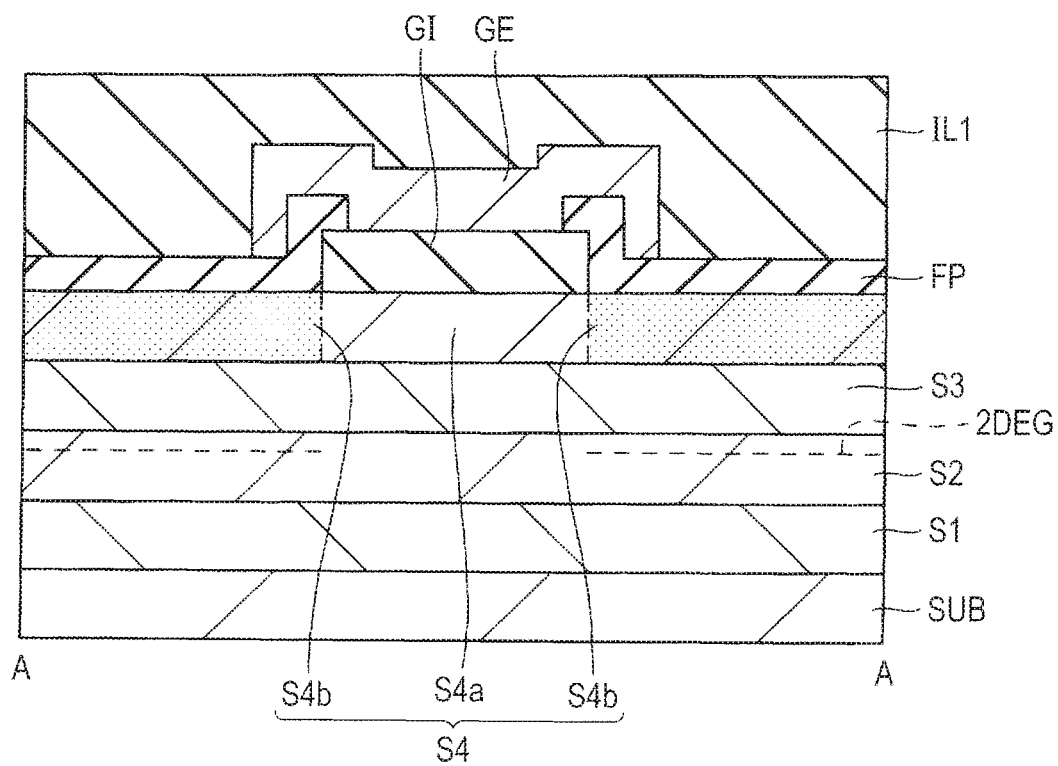
FIG. 29 is a sectional view illustrating a manufacturing step of the semiconductor device according to Second Embodiment.

Next, an interlayer insulating film IL1 is formed over the gate electrode GE, as illustrated in FIG. 29. For example, a silicon oxide film having a thickness of approximately 2 μm is deposited as the interlayer insulating film IL1 by using a CVD process or the like. In the present embodiment, the field plate insulating film FP serves as an etching stopper when a contact hole C1 is formed. A TEOS film may be used as the silicon oxide film.

Figure 30:
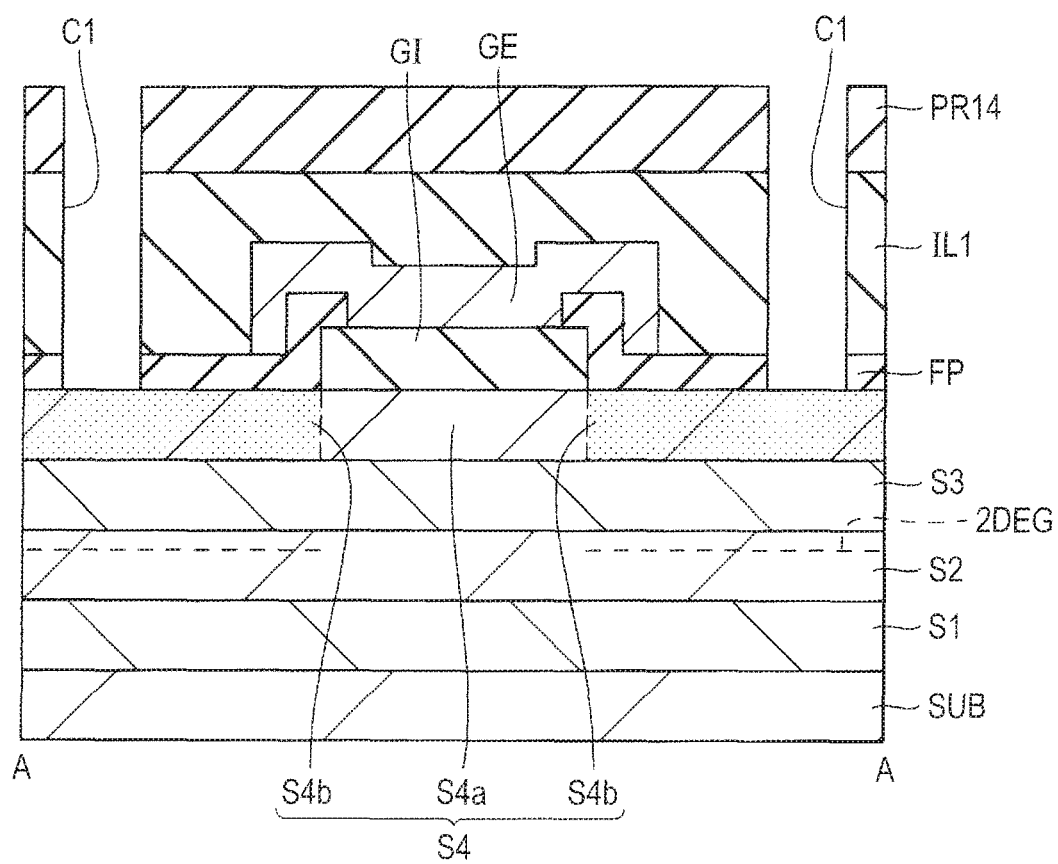
FIG. 30 is a sectional view illustrating a manufacturing step of the semiconductor device according to Second Embodiment.

Next, the contact hole C1 is formed in the interlayer insulating film IL1 by using a photolithography technique and an etching technique, as illustrated in FIG. 30. For example, a photoresist film PR14, respectively having openings in a source electrode coupling region and a drain electrode coupling region, is formed over the interlayer insulating film IL1 in the same way as in First Embodiment, and the contact hole C1 is formed by etching the interlayer insulating film IL1 and the field plate insulating film FP with the use of the photoresist film PR14 as a mask. Thereafter, the photoresist film PR14 is removed by a plasma stripping process or the like.

Figure 31:
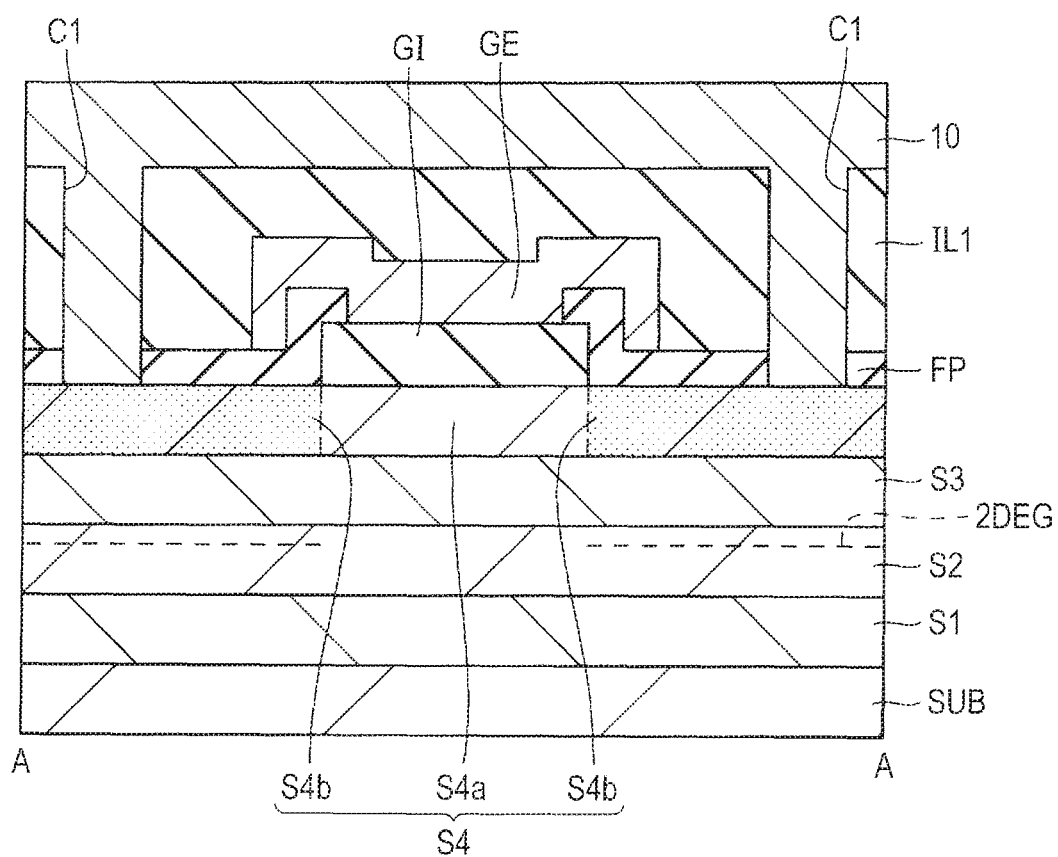
FIG. 31 is a sectional view illustrating a manufacturing step of the semiconductor device according to Second Embodiment.
Figure 32:
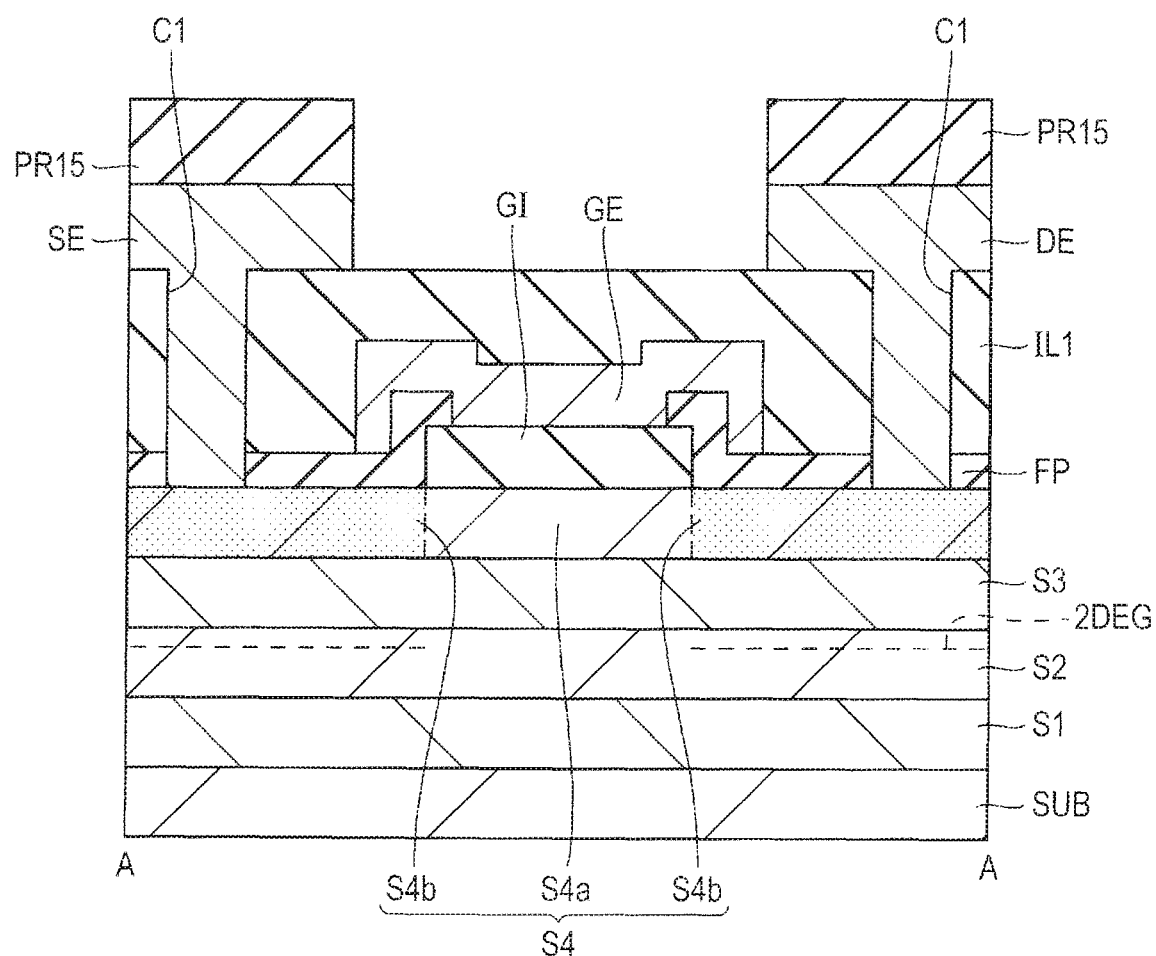
FIG. 32 is a sectional view illustrating a manufacturing step of the semiconductor device according to Second Embodiment.
Figure 33:
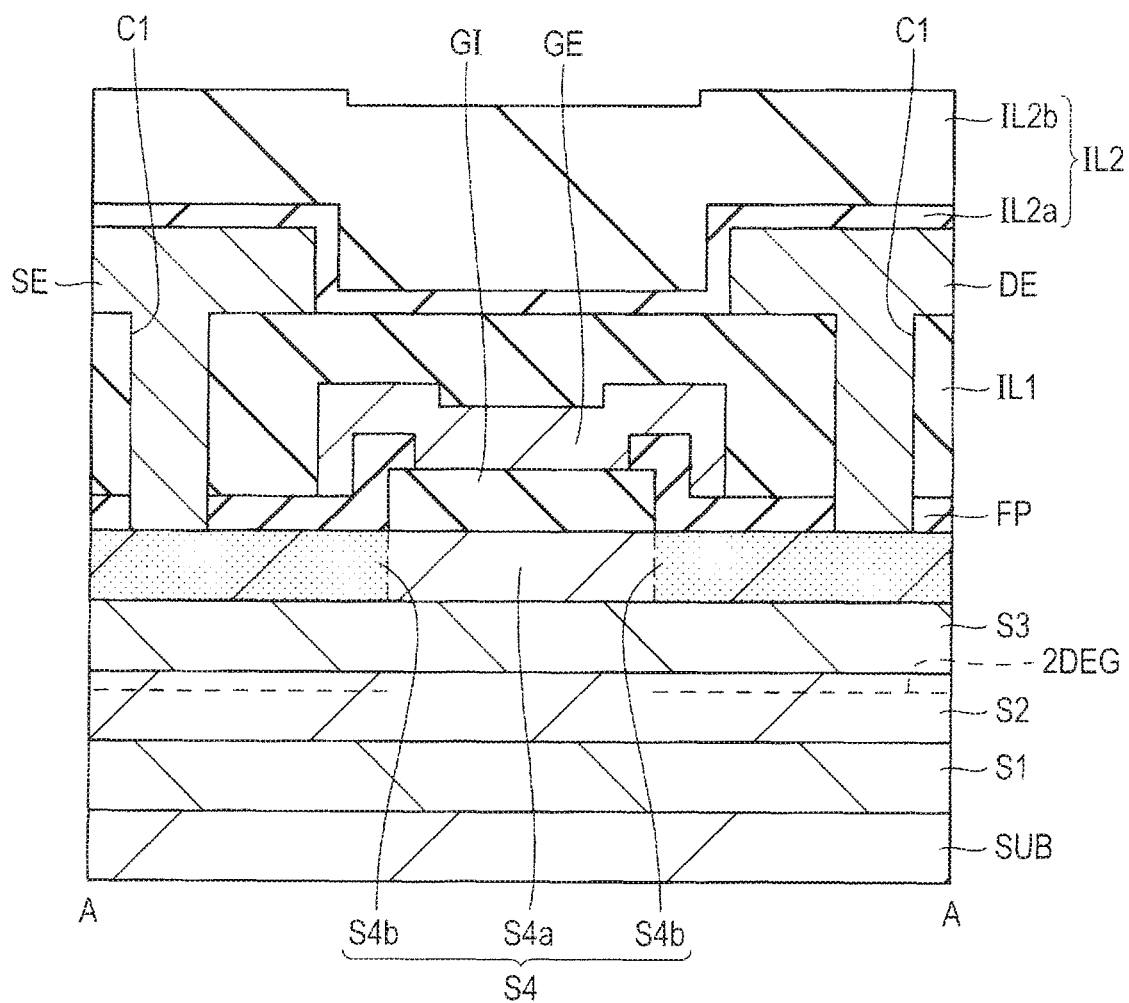
FIG. 33 is a sectional view illustrating a manufacturing step of the semiconductor device according to Second Embodiment.

Next, the source electrode SE and the drain electrode DE are formed in the contact holes C1 and over the interlayer insulating film IL1, respectively, as illustrated in FIGS. 31 and 32. For example, a conductive film 10 is formed over the interlayer insulating film IL1 including the inside of the contact hole C1 in the same way as in First Embodiment (FIG. 31). Next, a photoresist film PR15 is formed in the regions where the source electrode SE and the drain electrode DE are to be formed respectively, the regions being located over the conductive film, and the conductive film is etched by using the photoresist film PR15 as a mask, as illustrated in FIG. 32. Thereafter, the photoresist film PR15 is removed by a plasma stripping process or the like, and then an insulating film IL2 is formed over the interlayer insulating film IL1 including over the source electrode SE and over the drain electrode DE in the same way as in First Embodiment (FIG. 33).

Alternatively, an insulating film (protective film) having the above polyimide film or the like may be formed over the uppermost layer wiring after multilayer wiring to be coupled to the source electrode SE and the drain electrode DE is formed. Thereafter, the insulating film (laminated film of the polyimide film and the silicon nitride film) is removed to expose part of the lower conductive film (wiring) in the regions where the gate pad GP, the source pad SP, the drain pad DP, and the like (see FIG. 8) need to be electrically coupled to the outside, whereby pad portions (not illustrated) are formed.

The semiconductor device according to the present embodiment can be formed through the above steps. Herein, the above steps are merely one example, and the semiconductor device according to the embodiment may be manufactured by steps other than the above steps.

Also in the present embodiment, the function of suppressing 2DEG of the fourth nitride semiconductor layer S4 on both sides of the gate electrode GE can be lowered by contact processing with a silicon nitride film, whereby the 2DEG, which has been eliminated after the formation of the fourth nitride semiconductor layer S4, can be restored. Therefore, a transistor having a "planar structure" in which a mesa portion is not formed can be achieved. And, a failure caused by a damage during processing of the mesa portion described in First Embodiment can be eliminated, whereby the characteristics of the semiconductor device can be improved.

Further, the field plate insulating film FP is provided below the end portion of the gate electrode GE in the semiconductor device according to the present embodiment, and hence the breakdown voltage of the semiconductor device can be improved.

Third Embodiment

Application examples of First and Second Embodiments will be described in the present embodiment. Specifically, a transistor having a MOS configuration, in which the gate electrode GE is arranged over the first portion S4a of the fourth nitride semiconductor layer S4 via the gate insulating film GI, is obtained in First and Second embodiments, but a junction type FET (also referred to as JEFT) configuration, in which the gate insulating film GI is not provided, may be adopted. In the case of the junction type FET, there is no gate insulating film and the gate electrode GE directly contacts the lower nitride semiconductor layer, that is, they are in Schottky contact with each other. According to this junction type FET, the FET is not affected by the fixed positive charges and traps generated at the interface between the gate insulating film and the nitride semiconductor layer, and hence transistor characteristics stable at a higher threshold can be obtained.

First Application Example

Figure 34:
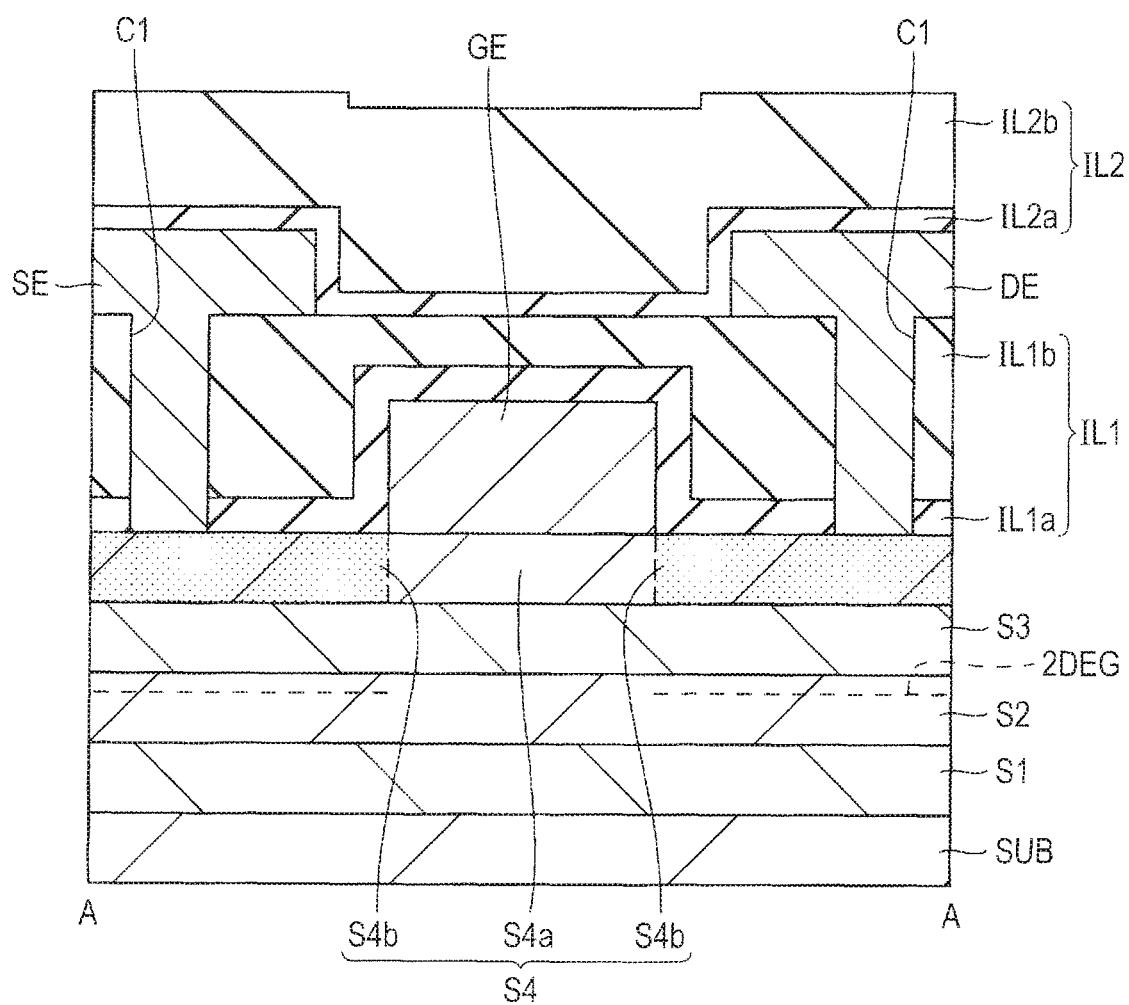
FIG. 34 is a sectional view illustrating a configuration of a semiconductor device according to First Application Example of Third Embodiment.

FIG. 34 is a sectional view illustrating a configuration of a semiconductor device according to First Application Example of the present embodiment. The semiconductor device according to the present application example corresponds to the configuration of the semiconductor device according to First Embodiment (FIG. 7), except that the former semiconductor device does not include the gate insulating film GI. As described above, the semiconductor device according to the application example is the same as the semiconductor device described in First Embodiment except that the gate insulating film GI is omitted, and hence the description thereof will be omitted. The semiconductor device according to the embodiment can be manufactured by, for example, the steps obtained by omitting the steps of forming the gate insulating film GI from the manufacturing steps described in First Embodiment.

Second Application Example

Figure 35:
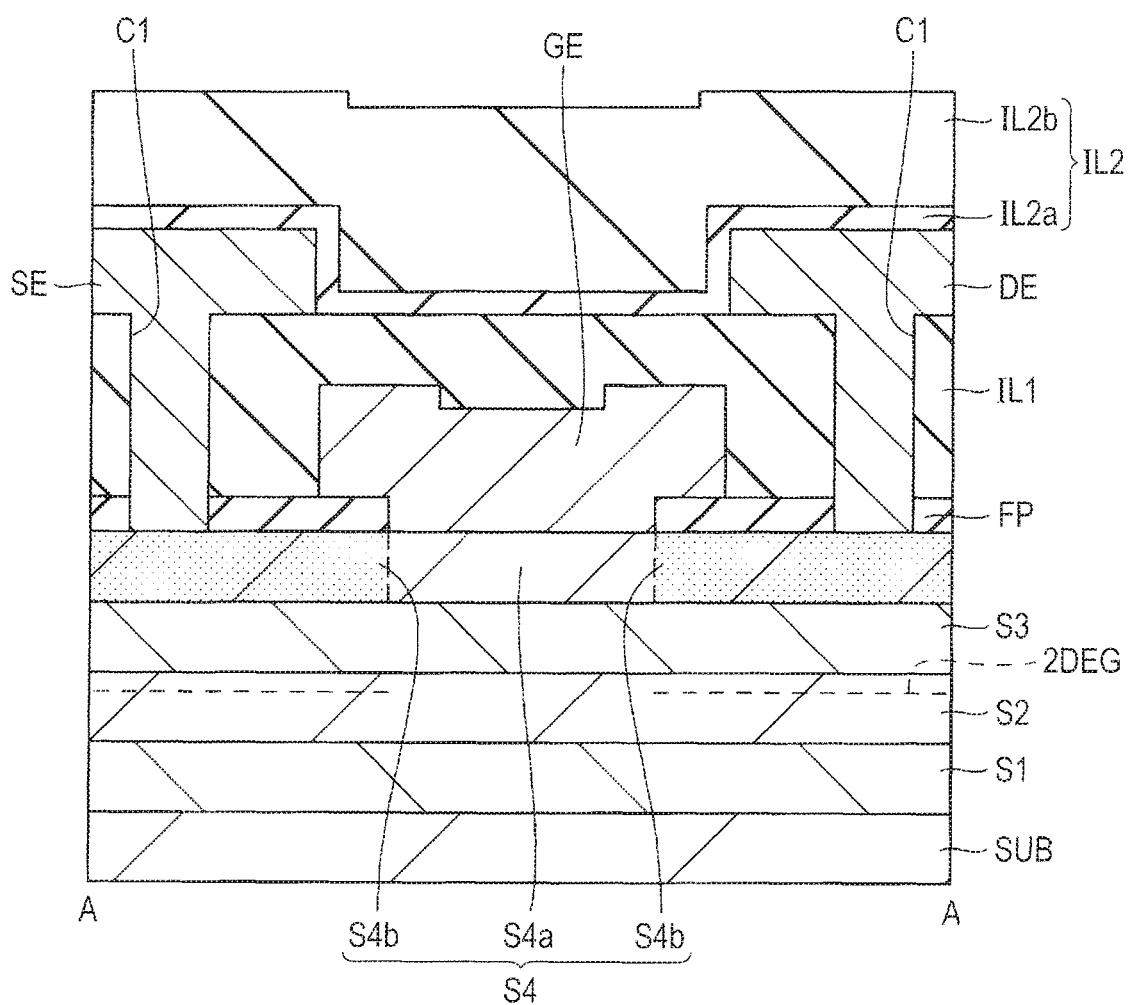
FIG. 35 is a sectional view illustrating a configuration of a semiconductor device according to Second Application Example of Third Embodiment.

FIG. 35 is a sectional view illustrating a configuration of a semiconductor device according to Second Application Example of the present embodiment. The semiconductor device according to the present application example corresponds to the configuration of the semiconductor device according to Second Embodiment, except that the former semiconductor device does not include the gate insulating film GI. As described above, the semiconductor device according to the application example is the same as the semiconductor device described in Second Embodiment except that the gate insulating film GI is omitted, and hence the description thereof will be omitted. The semiconductor device according to the embodiment can be manufactured by, for example, the steps obtained by omitting the steps of forming the gate insulating film GI from the manufacturing steps described in Second Embodiment.

Specifically, the gate insulating film GI illustrated in FIGS. 22 to 24 described in Second Embodiment is used as a mask film (e.g., a silicon oxide film). After the fourth nitride semiconductor layers S4 on both sides of the mask film are brought into contact with the silicon nitride film, the mask film is removed, and thereafter the field plate insulating film FP, the gate electrode GE, and the like are formed in the same way as in Second Embodiment.

Also in the semiconductor device (junction type FET) according to the present embodiment, the first portion (silicon nitride non-contact portion) S4a is arranged under the gate electrode GE and the second portions (silicon nitride contact portions) S4b are arranged on both sides thereof.

Therefore, the semiconductor device according to the present embodiment serves as a transistor having a "planar structure" in which a mesa portion is not formed, and a failure caused by a damage during processing of the mesa portion described in First Embodiment can be eliminated, whereby the characteristics of the semiconductor device can be improved.

The invention made by the present inventors has been specifically described above based on preferred embodiments; however, it is needless to say that the invention should not be limited to the preferred embodiments and various modifications may be made to the invention within a range not departing from the gist of the invention.

Figure 38:
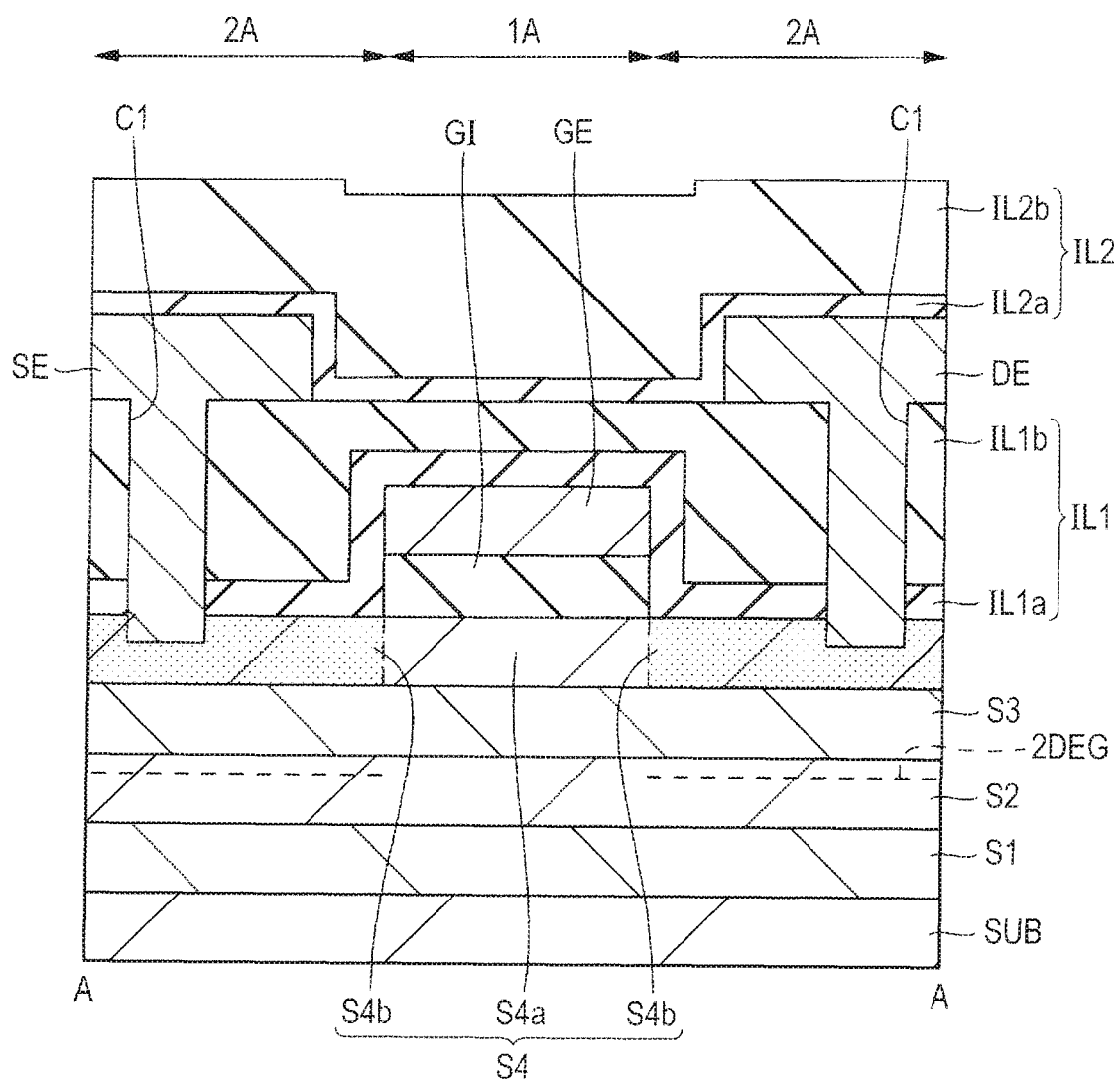
FIG. 38 is a sectional view illustrating a configuration of another semiconductor device.

For example, the thickness of each of the fourth nitride semiconductor layers (second portions S4b) S4 located under the contact holes C1 may be made small by performing overetching when the contact holes C1 are formed, as illustrated in FIG. 38. Alternatively, etching may be performed until the third nitride semiconductor layer S3 is exposed. FIG. 38 is a sectional view illustrating a configuration of another semiconductor device.

There are no restrictions on where the semiconductor devices described in the above embodiments are applied, but can be applied to, for example, PFC circuits, DC-DC converters, inverters, and the like.

What is claimed is:

1. A manufacturing method of a semiconductor device, comprising:
   (a) forming a second nitride semiconductor layer over a first nitride semiconductor layer;
   (b) forming a third nitride semiconductor layer over the second nitride semiconductor layer;
   (c) forming a fourth nitride semiconductor layer over the third nitride semiconductor layer;
   (d) forming a first film over a first region of the fourth nitride semiconductor layer; and
   (e) forming a silicon nitride film over the fourth nitride semiconductor layer and the first film,
   wherein after the (b), two-dimensional electron gas is generated near an interface between the second nitride semiconductor layer and the third nitride semiconductor layer,
   wherein after the (c), the two-dimensional electron gas is eliminated, and wherein after the (e), the two-dimensional electron gas is restored in second regions on both sides of the first region, the method further comprising;

after the (e), (f) removing the silicon nitride film.

2. The manufacturing method of a semiconductor device according to claim 1,
wherein the first film comprises a laminate of a gate insulating film and a gate electrode.

3. The manufacturing method of a semiconductor device according to claim 1,
wherein the first film comprises a gate electrode.

4. The manufacturing method of a semiconductor device according to claim 1,
wherein the silicon nitride film contains Si—H bonds and N—H bonds and a ratio of the Si—H bonds to the N—H bonds is 0.3 or more and 0.45 or less.

5. The manufacturing method of a semiconductor device according to claim 1, further comprising:
after the (f),
forming a source electrode and a drain electrode in second regions located on both sides of the first region of the fourth nitride semiconductor layer, respectively.

6. The manufacturing method of a semiconductor device according to claim 1, further comprising:
after the (f),
(g1) removing the first film; and
(g2) forming a gate electrode in the first region.

7. The manufacturing method of a semiconductor device according to claim 6, further comprising:
after the (g1) and before the (g2),
forming an opening by forming a first insulating film over the fourth nitride semiconductor layer and then by removing the first insulating film in the first region.

8. The manufacturing method of a semiconductor device according to claim 1,
wherein the first film comprises a gate insulating film.

9. The manufacturing method of a semiconductor device according to claim 8, further comprising:
after the (f),
(g) forming a gate electrode over the gate insulating film.

10. The manufacturing method of a semiconductor device according to claim 9, further comprising:
after the (f) and before the (g),
forming an opening by forming a first insulating film over the gate insulating film and the fourth nitride semiconductor layer and then by removing the first insulating film over the gate insulating film,
wherein in the (g), the gate insulating film and the gate electrode are in contact with each other at the opening.

11. A manufacturing method of a semiconductor device, comprising:
(a) forming a second nitride semiconductor layer over a first nitride semiconductor layer;
(b) forming a third nitride semiconductor layer over the second nitride semiconductor layer;
(c) forming a fourth nitride semiconductor layer over the third nitride semiconductor layer;
(d) forming a first film over a first region of the fourth nitride semiconductor layer;
(e) forming a silicon nitride film over the fourth nitride semiconductor layer and the first film; and
(f) removing the silicon nitride film,
wherein the electron affinity of the second nitride semiconductor layer is equal to or larger than the electron affinity of the first nitride semiconductor layer,
wherein the electron affinity of the third nitride semiconductor layer is smaller than the electron affinity of the first nitride semiconductor layer,
wherein the electron affinity of the fourth nitride semiconductor layer is larger than the electron affinity of the first nitride semiconductor layer, and
wherein the first film comprises a laminate of a gate insulating film and a gate electrode.

12. The manufacturing method of a semiconductor device according to claim 11,
wherein the silicon nitride film contains Si—H bonds and N—H bonds and a ratio of the Si—H bonds to the N—H bonds is 0.3 or more and 0.45 or less.

13. The manufacturing method of a semiconductor device according to claim 11, comprising:
after the (f),
forming a source electrode and a drain electrode in second regions located on both sides of the first region of the fourth nitride semiconductor layer, respectively.

* * * * *